(12) United States Patent
Matsushita

(10) Patent No.: US 12,361,997 B2
(45) Date of Patent: Jul. 15, 2025

(54) MTJ OPERATION METHODS EMPLOYING OPPOSITE POLARITY RECOVERY PULSE

(71) Applicant: Kioxia Corporation, Tokyo (JP)

(72) Inventor: Naoki Matsushita, Seoul (KR)

(73) Assignee: Kioxia Corporation, Tokyo (JP)

( * ) Notice: Subject to any disclaimer, the term of this patent is extended or adjusted under 35 U.S.C. 154(b) by 429 days.

(21) Appl. No.: 17/537,395

(22) Filed: Nov. 29, 2021

(65) Prior Publication Data

US 2023/0073548 A1   Mar. 9, 2023

(30) Foreign Application Priority Data

Sep. 6, 2021   (JP) .................................. 2021-144742

(51) Int. Cl.
   *G11C 11/16*   (2006.01)
(52) U.S. Cl.
   CPC ...... *G11C 11/1675* (2013.01); *G11C 11/1673* (2013.01)
(58) Field of Classification Search
   CPC .................. G11C 11/1673; G11C 11/1675
   See application file for complete search history.

(56) References Cited

U.S. PATENT DOCUMENTS

| 6,522,578 | B2 | 2/2003 | Poechmueller |
| 8,988,923 | B2 * | 3/2015 | Khalili Amiri ....... G11C 11/161 365/158 |
| 9,343,132 | B2 * | 5/2016 | Lee ..................... G11C 11/1659 |
| 9,378,817 | B2 | 6/2016 | Kawai et al. |
| 9,679,647 | B2 * | 6/2017 | Ueki .................. G11C 13/0069 |
| 9,966,123 | B2 * | 5/2018 | Matsuoka ........... G11C 11/1693 |
| 11,488,647 | B2 * | 11/2022 | Sun ....................... G11C 11/161 |
| 2013/0182496 | A1 | 7/2013 | Hoya |
| 2016/0225429 | A1 * | 8/2016 | Toh ..................... G11C 11/1659 |
| 2018/0075896 | A1 * | 3/2018 | Alaoui ................ G11C 11/1673 |
| 2019/0122716 | A1 * | 4/2019 | Al Azim ............. G11C 11/1675 |
| 2020/0013443 | A1 * | 1/2020 | Ohmori ............... G11C 11/1659 |
| 2021/0074915 | A1 | 3/2021 | Tsukamoto |
| 2021/0264972 | A1 * | 8/2021 | Tortorelli ............... G11C 16/26 |

FOREIGN PATENT DOCUMENTS

| JP | 2007004924 A | 1/2007 |
| JP | 2013058779 A | 3/2013 |
| JP | 5727948 B2 | 6/2015 |
| TW | 202111707 A | 3/2021 |

* cited by examiner

*Primary Examiner* — Sung Il Cho
(74) *Attorney, Agent, or Firm* — Holtz, Holtz & Volek PC

(57) ABSTRACT

According to one embodiment, a memory device includes a memory cell that includes a resistance change element and a switching element that are coupled in series; and a control circuit configured to perform a first operation to bring the resistance change element to a first resistance value based on a first current, a second operation to bring the resistance change element to a second resistance value different from the first resistance value based on a second current, and a third operation to determine whether the resistance change element is at the first resistance value or the second resistance value based on a third current. The control circuit is configured to pass two currents having different polarities alternately in the memory cell in a single operation.

16 Claims, 16 Drawing Sheets

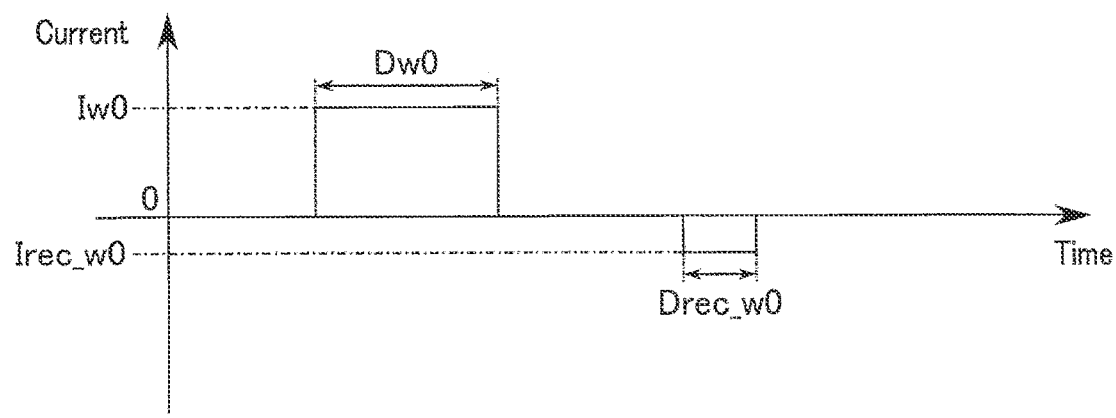
F I G. 5
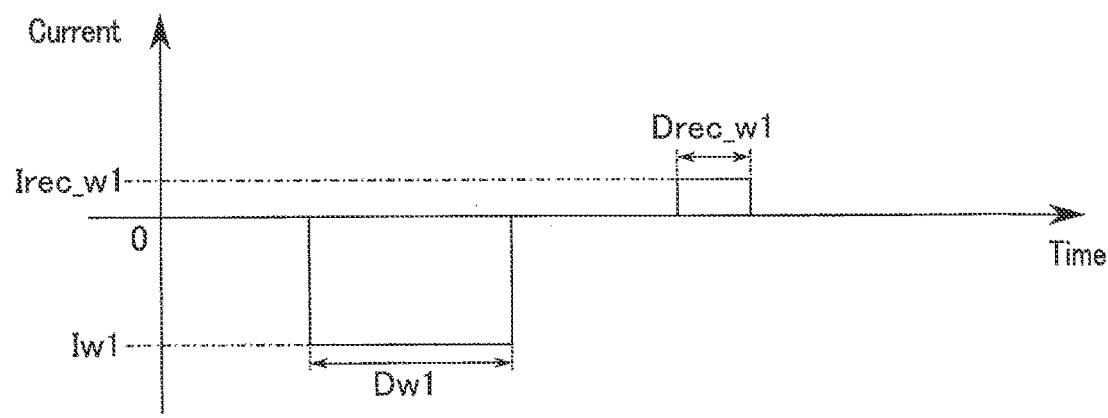
F I G. 6
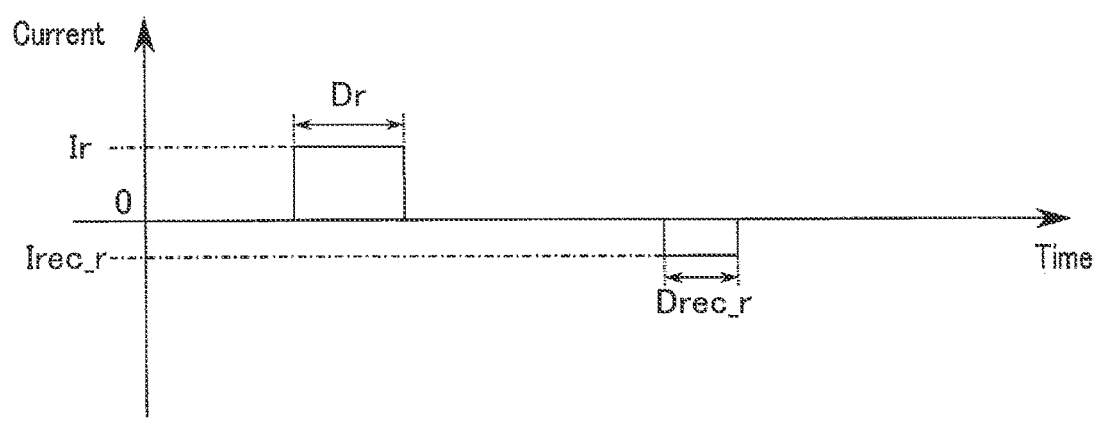
F I G. 7

MTJ OPERATION METHODS EMPLOYING OPPOSITE POLARITY RECOVERY PULSE

CROSS-REFERENCE TO RELATED APPLICATIONS

This application is based upon and claims the benefit of priority from Japanese Patent Application No. 2021-144742, filed Sep. 6, 2021, the entire contents of which are incorporated herein by reference.

FIELD

Embodiments described herein relate generally to a memory device.

BACKGROUND

A memory device using a resistance element as a storage element is known. A resistance element functions as a memory cell when coupled to a switching element in series. As a switching element, a 2-terminal type switching element is used.

BRIEF DESCRIPTION OF THE DRAWINGS

FIG. 5 is a timing chart showing an example of a write operation in the memory device according to the first embodiment.

FIG. 6 is a timing chart showing an example of a write operation in the memory device according to the first embodiment.

FIG. 7 is a timing chart showing an example of a read operation in the memory device according to the first embodiment.

DETAILED DESCRIPTION

In general, according to one embodiment, a memory device includes a memory cell that includes a resistance change element and a switching element that are coupled in series; and a control circuit configured to perform a first operation to bring the resistance change element to a first resistance value based on a first current, a second operation to bring the resistance change element to a second resistance value different from the first resistance value based on a second current, and a third operation to determine whether the resistance change element is at the first resistance value or the second resistance value based on a third current. The control circuit is configured to pass two currents having different polarities alternately in the memory cell in a single operation.

Hereinafter, embodiments will be described with reference to the drawings. In the descriptions below, constituent elements having the same functions and configurations will be denoted by the same reference symbols. To distinguish a plurality of structural elements having a common reference symbol from each other, an additional symbol is added after the common reference symbol.

1. First Embodiment

A first embodiment is described below.

1.1 Configuration

1.1.1 Memory System

Figure 1:
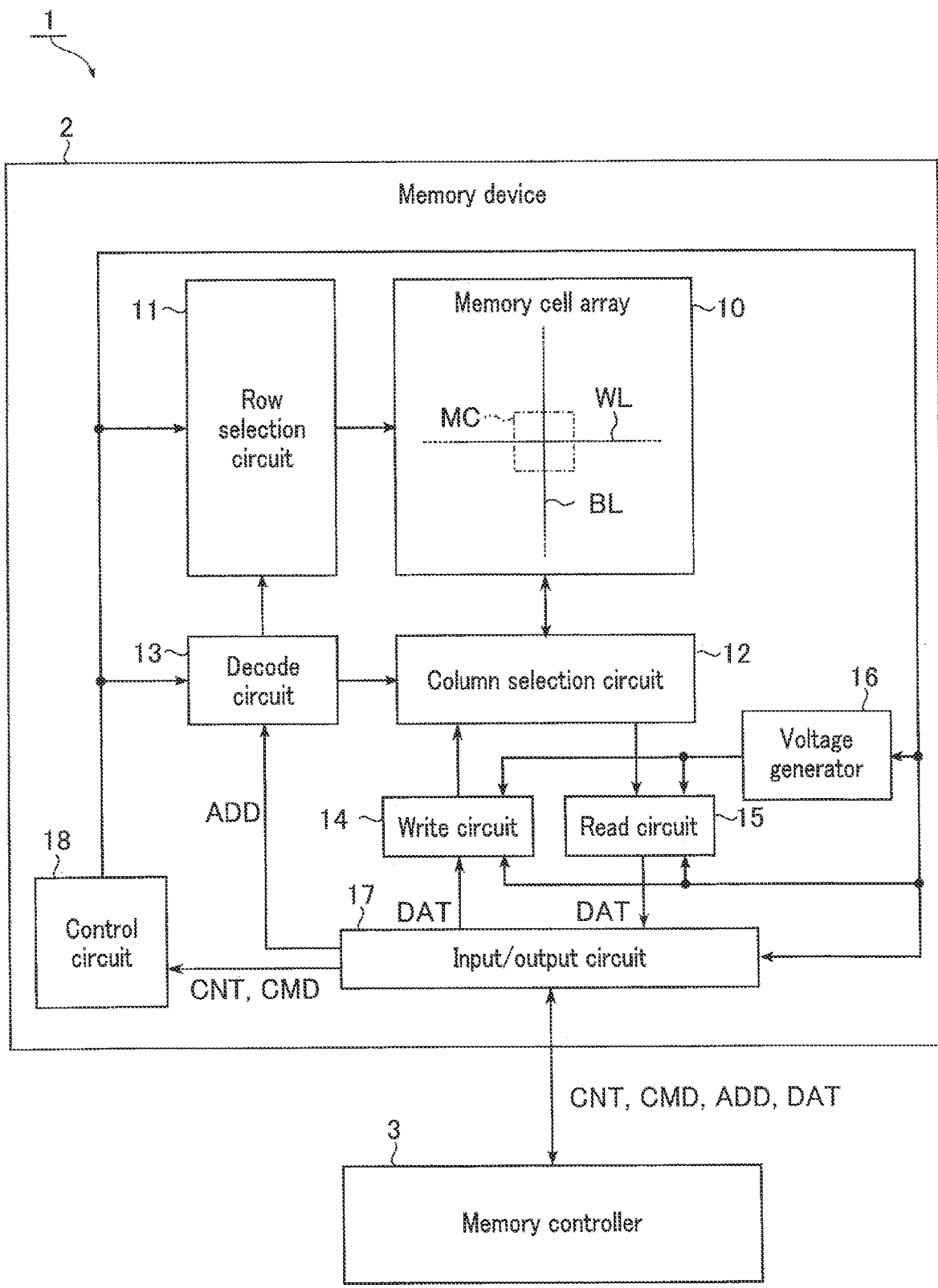
FIG. 1 is a block diagram showing a configuration example of a memory system that includes a memory device according to a first embodiment.

A configuration of a memory system that includes a memory device according to the first embodiment will be described. FIG. 1 is a block diagram showing a configuration example of a memory system that includes a memory device according to the first embodiment.

A memory system 1 is a storage device. The memory system 1 performs a data write operation and a data read operation. The memory system 1 includes a memory device 2 and a memory controller 3.

The memory device 2 is a magnetic memory device (magnetoresistive random access memory, MRAM), for example. The memory device 2 stores data in a nonvolatile manner. The memory device 2 includes a magnetoresistance effect element as a storage element. The magnetoresistance effect element is a type of resistance change element having a magnetoresistance effect brought by a magnetic tunnel junction (MTJ). The magnetoresistance effect element may be called an MTJ element.

The memory controller 3 is configured as an integrated circuit such as a system-on-a-chip (SoC). The memory controller 3 causes the memory device 2 to perform a write operation and a read operation, etc. in response to a request from an externally located host device (not shown). In a write operation, the memory controller 3 sends data to be written to the memory device 2. In a read operation, the memory controller 3 receives data that is read from the memory device 2.

1.1.2 Memory Device

Next, an internal configuration of the memory device according to the first embodiment will be described with continuous reference to FIG. 1.

The memory device 2 includes a memory cell array 10, a row selection circuit 11, a column selection circuit 12, a decode circuit 13, a write circuit 14, a read circuit 15, a voltage generator 16, an input/output circuit 17, and a control circuit 18.

The memory cell array 10 is a data storage unit in the memory device 2. The memory cell array 10 includes a plurality of memory cells MC. Each of the memory cells MC is associated with a set of a row and a column. The memory cells MC of the same row are coupled to the same word line WL, and the memory cells MC of the same column are coupled to the same bit line BL.

The row selection circuit 11 is a circuit for selecting a row of the memory cell array 10. The row selection circuit 11 is coupled to the memory cell array 10 via word lines WL. The row selection circuit 11 is supplied with a decoding result of an address ADD from the decode circuit 13 (row address). The row selection circuit 11 selects word line WL corresponding to a row based on the decoding result of address ADD. Hereinafter, a word line WL which is selected will be called a "selected word line WL". Word lines WL other than a selected word line WL will be called "non-selected word lines WL".

The column selection circuit 12 is a circuit for selecting a column of the memory cell array 10. The column selection circuit 12 is coupled to the memory cell array 10 via a bit line BL. The column selection circuit 12 is supplied with a decoding result of an address ADD received from the decode circuit 13 (column address). The column selection circuit 12 selects a bit line BL corresponding to a column based on the decoding result of an address ADD. Hereinafter, a bit line BL which is selected will be called a "selected bit line BL". Bit lines BL other than a selected bit line BL will be called "non-selected bit lines BL".

A memory cell MC specified by a selected word line WL and a selected bit line BL is called a "selected memory cell MC". The memory cells MC other than the selected memory cell MC will be called "non-selected memory cells MC". It is possible to pass a predetermined current thorough a selected memory cell MC via a selected word line WL and a selected bit line BL.

The decode circuit 13 is a decoder that decodes an address ADD received from the input/output circuit 17. The decode circuit 13 supplies the decoding result of an address ADD to the row selection circuit 11 and the column selection circuit 12. The address ADD includes an address of a column to be selected and an address of a row to be selected.

The write circuit 14 includes a write driver (not shown), for example. The write circuit 14 writes data in a memory cell MC in a write operation.

The read circuit 15 includes a sense amplifier (not shown) for example. The read circuit 15 reads data from a memory cell MC in a read operation.

The voltage generator 16 generates voltages for various types of operations in the memory cell array 10, using a power supply voltage supplied from a device (not shown) externally to the memory device 2. For example, the voltage generator 16 generates various types of voltages required in a write operation and outputs the voltages to the write circuit 14. In addition, the voltage generator 16, for example, generates various types of voltages required in a read operation and outputs the voltages to the read circuit 15.

The input/output circuit 17 governs communications with the memory controller 3. The input/output circuit 17 transfers an address ADD received from the memory controller 3 to the decode circuit 13. The input/output circuit 17 transfers a command CMD received from the memory controller 3 to the control circuit 18. The input/output circuit 17 sends and receives various control signals CNT to and from the memory controller 3 and the control circuit 18. The input/output circuit 17 transfers data DAT received from the memory controller 3 to the write circuit 14. The input/output circuit 17 outputs data DAT transferred from the read circuit 15 to the memory controller 3.

The control circuit 17 includes, for example, a processor, such as a central processing unit (CPU), and a read only memory (ROM). The control circuit 18 controls, based on a control signal CNT and a command CMD, the circuits included in the memory device 2, namely the row selection circuit 11, the column selection circuit 12, the decode circuit 13, the write circuit 14, the read circuit 15, the voltage generator 16, and the input/output circuit 18.

1.1.3 Memory Cell Array

Next, an example of a circuit configuration of the memory cell array of the memory device according to the first embodiment will be described.

Figure 2:
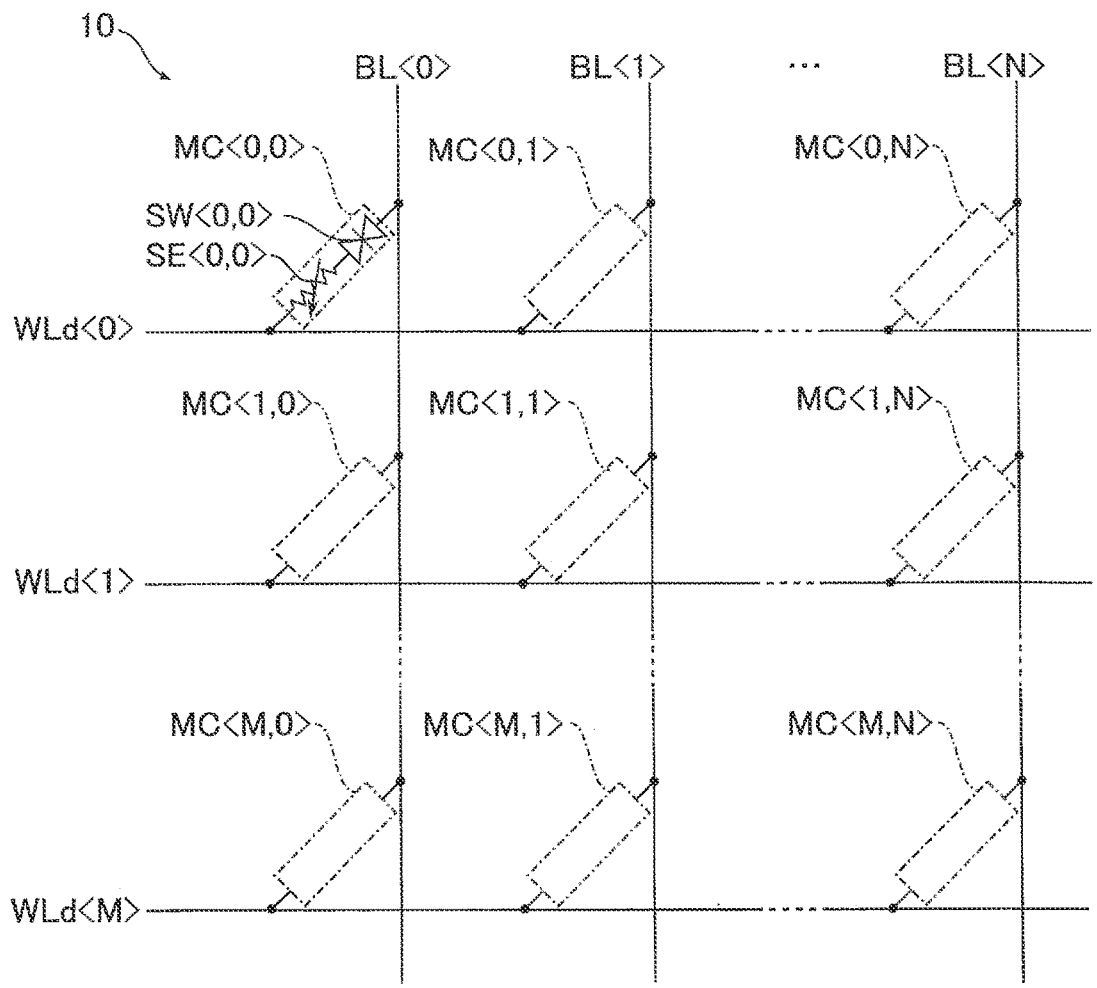
FIG. 2 is a circuit diagram showing a circuit configuration example of a memory cell array according to the first embodiment.

FIG. 2 is a diagram showing an example of the circuit configuration of the memory cell array according to the first embodiment. In FIG. 2, each of the word lines WL and the bit lines BL is shown, and are distinguished by appended symbols including an index ("< >").

The memory cell array 10 includes a plurality of memory cells MC, a plurality of word lines WL, and a plurality of bit lines BL. In the example shown in FIG. 2, a plurality of memory cells MC include (M+1)×(N+1) memory cells, MC<0,0>, MC<0,1>, ..., MC<0,N>, MC<1,0>, ..., and MC<M,N> (each of M and N is an integer equal to or greater than 2). M and N are integers equal to or greater than 2 in the example of FIG. 2; however, the embodiment is not limited to this example. M and N may be either 0 or 1. The plurality of word lines WL include (M+1) word lines, WL<0>, WL<1>, ..., and WL<M>. The plurality of bit lines BL include (N+1) word lines, BL<0>, BL<1>, ..., and BL<N>.

A plurality of memory cells MC are arranged in a matrix pattern. Each memory cell MC is associated with a set of a single word line WL and a single bit line BL. In other words, memory cell MC<i,j> (0≤i≤M, 0≤j≤N) is coupled to word line WL<i> and bit line BL<j>. Memory cell MC<i,j> includes switching element SW<i,j> and resistance change element SE<i,j>. Switching element SW<i,j> and resistance change element SE<i,j> are coupled in series.

A switching element SW is a 2-terminal type switching element. A 2-terminal type switching element differs from a 3-terminal type switching element, such as a transistor, etc., in its having no third terminal. More specifically, for example if a voltage applied to a corresponding memory cell MC is lower than a threshold voltage Vth, the switching element SW interrupts a current (turns to an off state), serving as an insulator having a large resistance value. If a voltage applied to a corresponding memory cell MC is equal to or greater than a threshold voltage Vth, a switching element SW passes a current (turns to an on state), serving as a conductor having a small resistance value. The switching element SW switches between passing and interrupting a current in accordance with a magnitude of a current applied to a corresponding memory cell MC, regardless of the polarity of the voltage applied to the two terminals (in other words, regardless of the direction of the current passing between the two terminals).

According to the above-described configuration, when a memory cell MC is selected, the switching element SW included in the selected memory cell MC is turned to an on state. It is thereby possible to pass a current into the resistance change elements SE in the selected memory cell MC.

The resistance change element SE is a storage element. The resistance change element SE may switch its resistance value between a low-resistance state and a high-resistance state based on a current that flows when the switching element SW is in an on state. The resistance change element SE stores data in a nonvolatile manner according to the change in its resistance state.

1.1.4 Resistance Change Element

Next, a configuration of the resistance change element according to the first embodiment is described.

Figure 3:
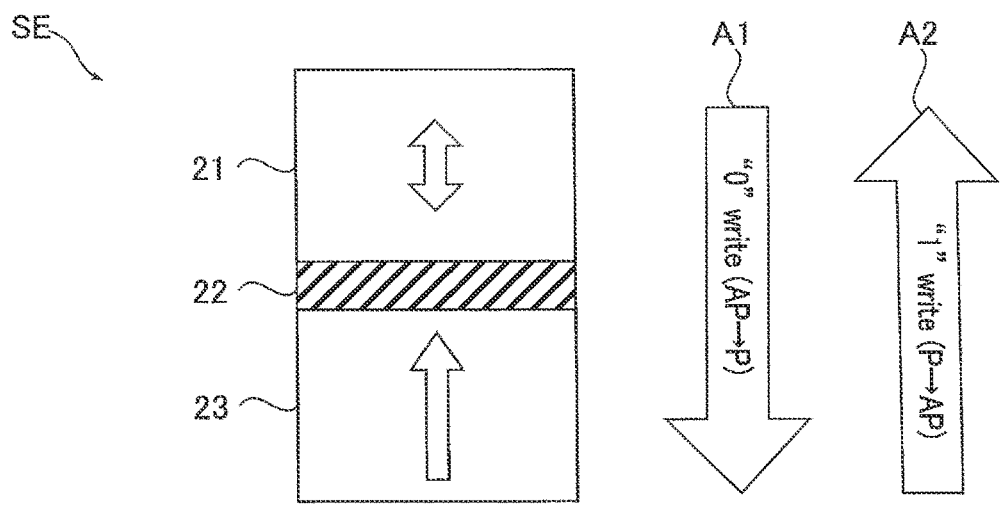
FIG. 3 is a cross-sectional view showing a configuration example of a resistance change element according to the first embodiment.

FIG. 3 is a cross-sectional view showing a configuration example of the resistance change element according to the first embodiment. FIG. 3 shows an example of a configuration of the resistance change element SE in a case where it is a magnetoresistance effect element (MTJ element). When the resistance change element SE is a magnetoresistance effect element, it includes a ferromagnetic layer 21, a nonmagnetic layer 22, and a ferromagnetic layer 23. The ferromagnetic layer 21, the nonmagnetic layer 22, and the ferromagnetic layer 23 are stacked above a semiconductor substrate (not shown).

The ferromagnetic layer 21 is an electric conductive film having ferromagnetic properties. The ferromagnetic layer 21 is used as a storage layer. The ferromagnetic layer 21 has an axis of easy magnetization in a direction perpendicular to the layer stack plane. The magnetization direction of the ferromagnetic layer 21 is variable. The ferromagnetic layer 21 includes iron (Fe). The ferromagnetic layer 21 may further include at least one of cobalt (Co) or nickel (Ni). The ferromagnetic layer 21 may further include boron (B). Specifically, the ferromagnetic layer 21 may include, for example, cobalt-iron-boron (FeCoB) or iron boride (FeB).

On the film surface of the ferromagnetic layer 21, a nonmagnetic layer 22 is provided. The nonmagnetic layer 22 is an insulating film having nonmagnetic properties. The nonmagnetic layer 22 is used as a tunnel barrier layer. The nonmagnetic layer is provided between the ferromagnetic layer 21 and the ferromagnetic layer 23, and forms a magnetic tunnel junction in conjunction with these ferromagnetic layers. In addition, during a crystallization process of the ferromagnetic layer 21, the nonmagnetic layer 22 functions as a seed material that serves as a nucleus for growth of a crystalline film from an interface with the ferromagnetic layer 21. The nonmagnetic layer 22 has a NaCl crystal structure with its film plane oriented in a (001) plane. The nonmagnetic layer 22 contains magnesium oxide (MgO).

The ferromagnetic layer 23 is provided on a film plane of the nonmagnetic layer 22 located opposite to a film plane on which the ferromagnetic layer 21 is provided with respect to the nonmagnetic layer 22. The ferromagnetic layer 23 is an electric conductive film having ferromagnetic properties. The ferromagnetic layer 23 is used as a reference layer. The ferromagnetic layer 23 has an axis of easy magnetization in a direction perpendicular to the film plane. The magnetization direction of the ferromagnetic layer 23 is fixed. In the example shown in FIG. 3, the magnetization direction of the ferromagnetic layer 23 is in the direction of the ferromagnetic layer 21. "Fixed magnetization direction" indicates the magnetization direction being unchanged by a torque large enough to reverse the magnetization direction of the ferromagnetic layer 21. The ferromagnetic layer 23 contains at least one compound selected from the group consisting of, for example, cobalt platinum (CoPt), cobalt nickel (CoNi), and cobalt palladium (CoPd).

The magnetoresistance effect element may take either a low-resistance state or a high-resistance state, according to whether the relative relationship between the magnetization direction of the storage layer and the magnetization direction of the reference layer is parallel or antiparallel. In the following, a case where a spin injection write method is used as a method of varying the resistance state of the magnetoresistance effect element will be explained. With the spin injection write method, a spin torque is produced by passing a write current through the magnetoresistance effect element. Then, with the produced spin torque, the magnetization direction of the storage layer with respect to the magnetization direction of the reference layer is controlled.

When a write current Iw0 flows in the magnetoresistance effect element from the storage layer to the reference layer (in the direction of arrow A1 in FIG. 3), the relative relationship of the magnetization direction between the storage layer and the reference layer becomes parallel. When the relationship is in a parallel state, the magnetoresistance effect element is set to a low-resistance state. The low-resistance state is associated with data "0", for example. The low-resistance state is called a "P (parallel) state".

When a write current Iw1, which is larger than the write current Iw0, flows in the magnetoresistance effect element from the reference layer to the storage layer (in the direction of arrow A2 in FIG. 3), the relative relationship of the magnetization direction between the storage layer and the reference layer becomes anti-parallel. When the relationship is in an anti-parallel state, the magnetoresistance effect element is set to a high-resistance state. The high-resistance state is associated with data "1", for example. The high-resistance state is also referred to as an "AP (anti-parallel) state".

When the read current Ir flows in the magnetoresistance effect element, the magnetization directions of the storage layer and the reference layer do not change. The read circuit 15 determines whether the resistance state of the magnetoresistance effect element is a P state or an AP state based on the read current Ir. It is thereby possible for the read circuit 15 to read data from a memory cell MC.

Hereinafter, for the sake of brevity, assume that the polarity of a signal for passing a current in the direction of arrow A1 is positive. Similarly, the polarity of a signal for passing a current in the direction of arrow A2 is negative. The polarity of a read current Ir is positive.

The correspondence between the resistance state and data is not limited to the foregoing example. For example, a P state and an AP state may be associated with data "1" and data "0", respectively. The polarity of a read current Ir may be negative.

1.2 Operation

Next, a series of operations in the memory device according to the first embodiment will be described. A series of operations in the memory device 2 is performed in response to commands sent from the memory controller 3, for example.

1.2.1 Flowchart

Figure 4:
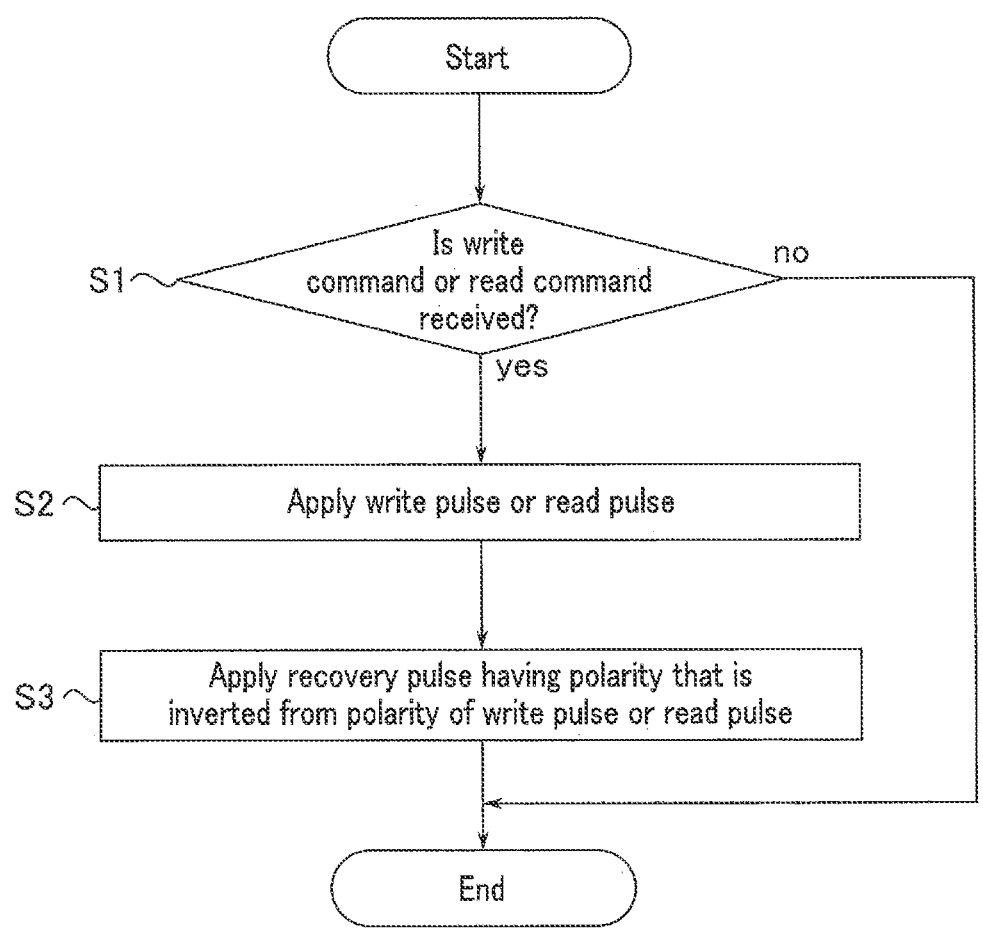
FIG. 4 is a flowchart showing an example of a series of operations in the memory device according to the first embodiment.

FIG. 4 is a flowchart showing an example of a series of operations in the memory device according to the first embodiment.

When a command is received from the memory controller 3 ("Start"), the control circuit 18 of the memory device 2 determines whether or not the received command is either a write command or a read command (S1).

If the received command is either a write command or a read command (Yes in S1), the row selection circuit 11 and the column selection circuit 12 apply either a write pulse or a read pulse to a selected memory cell MC (S2). Specifically, if the received command is a write command, the row selection circuit 11 and the column selection circuit 12 apply a write pulse to a selected memory cell MC. If the received command is a read command, the row selection circuit 11 and the column selection circuit 12 apply a read pulse to a selected memory cell MC.

After the process in S2, the row selection circuit 11 and the column selection circuit 12 apply a recovery pulse having a polarity that is inverted from a polarity of the write pulse or the read pulse to the selected memory cell MC (S3). Specifically, if a write pulse is applied in the process in S2, the row selection circuit 11 and the column selection circuit 12 apply a recovery pulse having a polarity that is inverted from a polarity of the write pulse to the selected memory cell MC. If a read pulse is applied in the process in S2, the row selection circuit 11 and the column selection circuit 12 apply a recovery pulse having a polarity that is inverted from a polarity of the read pulse to the selected memory cell MC.

After the process in S3, or if the received command is neither a write command nor a read command (No in S1), the series of operations in the memory device 2 is finished ("End").

A pulse is a signal applied to a selected memory cell MC during a finite period of time. A pulse includes a voltage signal applied to a selected memory cell MC. A pulse includes a current signal made to flow in the selected memory cell MC by the voltage signal.

1.2.2 Timing Chart

FIGS. 5 and 6 each is a timing chart showing an example of a write operation in the memory device according to the first embodiment. FIG. 7 is a timing chart showing an example of a read operation in the memory device according to the first embodiment. The write operation shown in FIG. 5 corresponds to an operation by which the resistance change element SE is turned to a P state (a write operation for data "0"). The write operation shown in FIG. 6 corresponds to an operation by which the resistance change element SE is turned to an AP state (a write operation for data "1").

When data "0" is written, the switching element SW in the selected memory cell MC is turned to an on state when a write voltage Vw0 (not shown) is applied. Thus, a write current Iw0 is applied to the selected memory cell MC over a period Dw0. Thereafter, when a voltage Vrec_w0 (not shown) is applied, the switching element SW in the selected memory cell MC is turned to an on state. Thus, a current Irec_w0 is applied to the selected memory cell MC over a period Drec_w0. The period of time between the period Dw0 and the period Drec_w0 may be set to a discretionarily determined length. The write current Iw0 has a positive polarity, whereas the current Irec_w0 has a negative polarity.

When data "1" is written, the switching element SW in the selected memory cell MC is turned to an on state when a write voltage Vw1 (not shown) is applied. Thus, a write current Iw1 is applied to the selected memory cell MC over a period Dw1. Thereafter, when a voltage Vrec_w1 (not shown) is applied, the switching element SW in the selected memory cell MC is turned to an on state. Thus, a current Irec_w1 is applied over a period Drec_w1. The period of time between the period Dw1 and the period Drec_w1 may be set to a discretionarily determined length. The write current Iw1 is larger than the write current Iw0 and has a polarity that is inverted from the polarity of the write current Iw0. The period Dw1 is longer than the period Dw0. The write current Iw1 has a negative polarity, whereas the current Irec_w1 has a positive polarity.

When data is read, the switching element SW in the selected memory cell MC is turned to an on state when a read voltage Vr (not shown) is applied. Thus, a read current Ir is applied to the selected memory cell MC over a period Dr. Thereafter, when a voltage Vrec_r (not shown) is applied, the switching element SW in the selected memory cell MC is turned to an on state. Thus, a current Irec_r is applied over a period Drec_r. The period of time between the period Dr and the period Drec_r may be set to a discretionarily determined length. The read current Ir is smaller than the write currents Iw0 and Iw1. The period Dr is shorter than the periods Dw0 and Dw1. The read current Ir has a positive polarity, whereas the current Irec_r has a negative polarity.

Each of the currents Irec_w0, Irec_w1, and Irec_r is smaller than the write currents Iw0 and Iw1. Each of the currents Irec_w0, Irec_w1, and Irec_r may be smaller than the read current Ir. The currents Irec_w0, Irec_w1, and Irec_r may be mutually equal. The currents Irec_w0, Irec_w1, and Irec_r may be mutually different.

Each of the periods Drec_w0, Drec_w1, and Drec_r is shorter than the periods Dw0 and Dw1. Each of the periods Drec_w0, Drec_w1, and Drec_r may be shorter than the period Dr. The periods Drec_w0, Drec_w1, and Drec_r may be mutually equal. The periods Drec_w0, Drec_w1, and Drec_r may be mutually different.

Each of the voltages Vrec_w0, Vrec_w1, and Vrec_r is smaller than the write voltages Vw0 and Vw1. Each of the voltages Vrec_w0, Vrec_w1, and Vrec_r may be smaller than the read voltage Vr. The voltages Vrec_w0, Vrec_w1, and Vrec_r may be mutually equal. The voltages Vrec_w0, Vrec_w1, and Vrec_r may be mutually different.

1.3 Advantageous Effects of First Embodiment

According to the first embodiment, the memory device 2 alternately applies the currents Iw0 and Irec_w0 having different polarities in this order to a selected memory cell MC in a write operation for data "0". The memory device 2 alternately applies the currents Iw1 and Irec_w1 having different polarities in this order to a selected memory cell MC in a write operation for data "1". The memory device 2 alternately applies the currents Ir and Irec_r having different polarities in this order to a selected memory cell MC in a read operation. It is thereby possible to alternately turn the switching element SW in a selected memory cell MC to an on state with two signals having different polarities every time a write operation and a read operation are performed. For this reason, it is possible to prevent an imbalance in polarities of the signals that turn the switching elements SW to an on state. Thus, it is possible to prevent degradation of endurance of the switching elements SW.

1.4 Modifications of First Embodiment

In the foregoing first embodiment, a case where a recovery pulse is applied in all write operations and read operations is explained; however, the first embodiment is not limited thereto. For example, if the order of performing a write operation and a read operation is known in advance, an application of a recovery pulse may be omitted.

1.4.1 Flowchart

Figure 8:
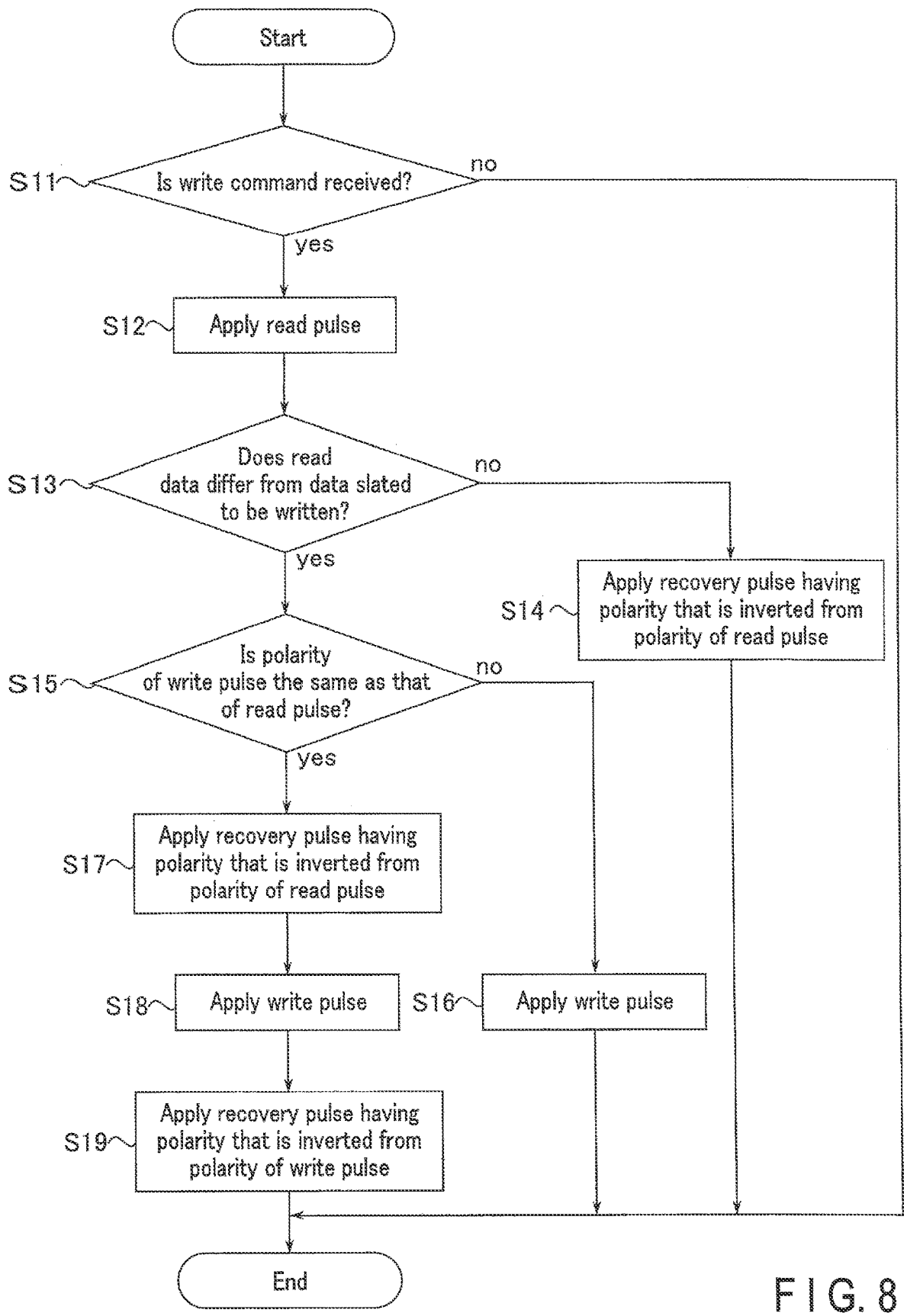
FIG. 8 is a flowchart showing an example of a series of operations in a memory device according to a modification of the first embodiment.

FIG. 8 is a flowchart showing an example of a series of operations in the memory device according to a modification of the first embodiment.

When a command is received from the memory controller 3 ("Start"), the control circuit 18 determines whether or not the received command is a write command (S11).

If the received command is not a write command (No in S11), the series of operations in the memory device 2 is finished ("End").

If the received command is a write command (Yes in S11), the control circuit 18 performs a read operation before a write operation. The row selection circuit 11 and the column selection circuit 12 apply a read pulse to a selected memory cell MC (S12).

The read circuit 15 reads data from the selected memory cell MC based on the read pulse applied in the process in S12. The control circuit 18 determines whether or not the read data differs from the data to be written by the received write command (S13).

If the read data matches the data to be written (No in S13), the row selection circuit 11 and the column selection circuit 12 apply a recovery pulse having a polarity that is inverted from a polarity of the write pulse to the selected memory cell MC (S14). After the process in S14, the series of operations in the memory device 2 is finished ("End").

If the read data differs from the data to be written (Yes in S13), the control circuit 18 determines whether or not the polarity of the write pulse corresponding to the data to be written is the same as the polarity of the read pulse corresponding to the read data (S15).

If the polarity of the write pulse differs from the polarity of the read pulse (No in S15), the row selection circuit 11 and the column selection circuit 12 apply a write pulse to the selected memory cell MC (S16). After the process in S16, the series of operations in the memory device 2 is finished ("End").

If the polarity of the write pulse is the same as the polarity of the read pulse (Yes in S15), the row selection circuit 11 and the column selection circuit 12 apply a recovery pulse having a polarity that is inverted from the polarity of the read pulse (S17).

After the process in S17, the row selection circuit 11 and the column selection circuit 12 apply a write pulse to the selected memory cell MC (S18).

After the process in S18, the row selection circuit 11 and the column selection circuit 12 apply a recovery pulse having a polarity that is inverted from the polarity of the write pulse to the selected memory cell MC (S19). After the process in S19, the series of operations in the memory device 2 is finished ("End").

1.4.2 Timing Chart

Figure 9:
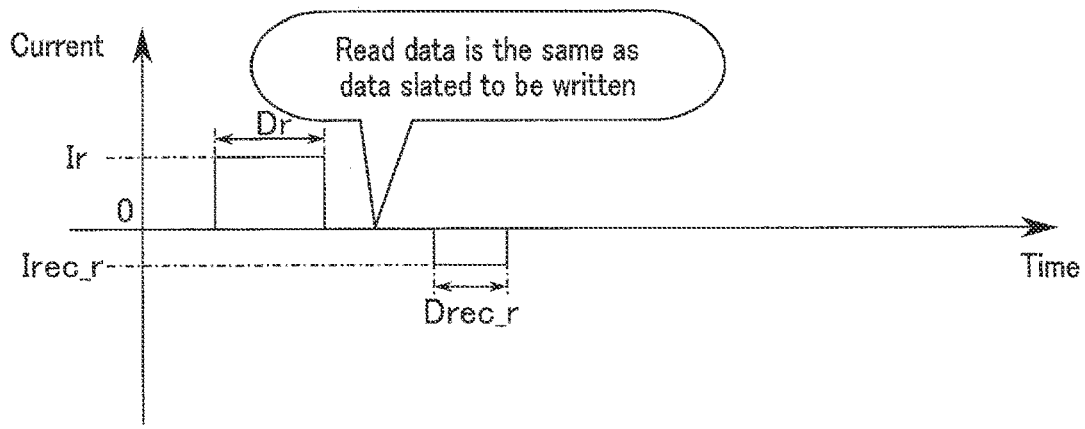
FIG. 9 is a timing chart showing a first example of a write operation accompanied by a read operation in the memory device according to the modification of the first embodiment.
Figure 10:
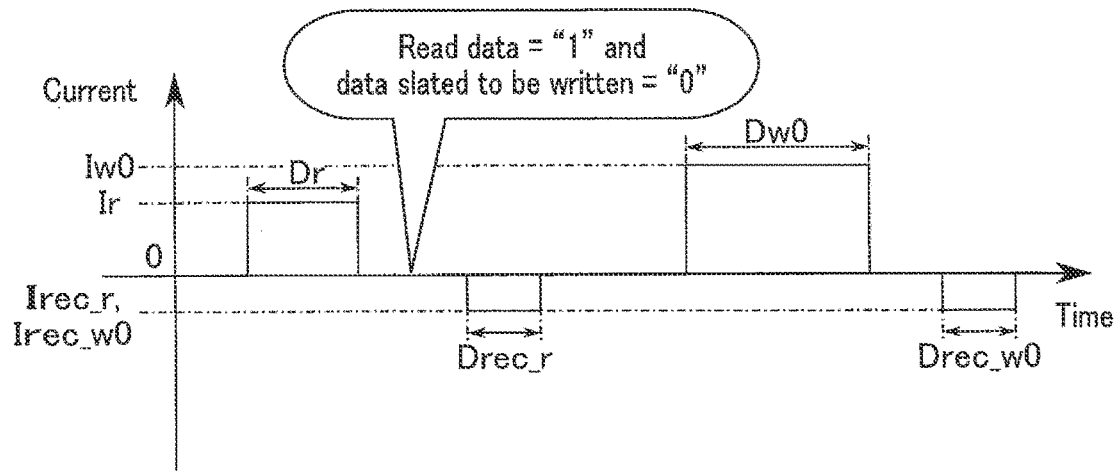
FIG. 10 is a timing chart showing a second example of a write operation accompanied by a read operation in the memory device according to the modification of the first embodiment.
Figure 11:
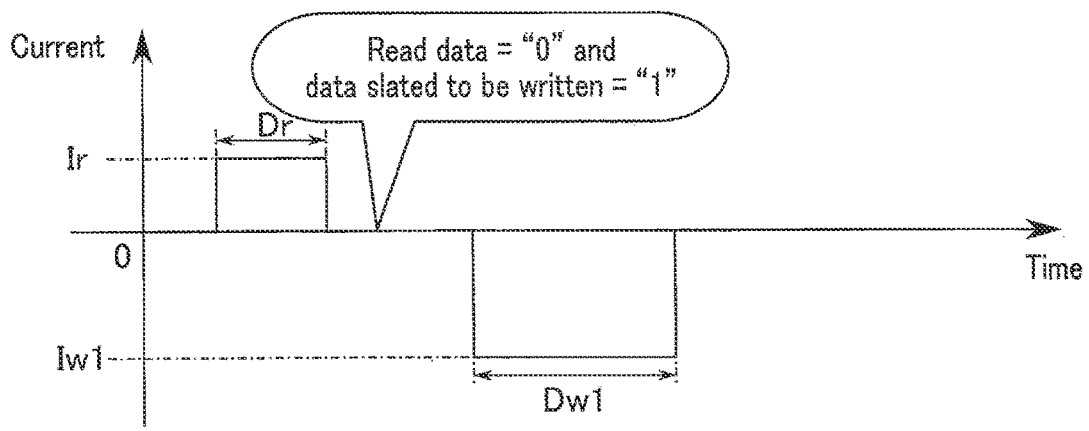
FIG. 11 is a timing chart showing a third example of a write operation accompanied by a read operation in the memory device according to the modification of the first embodiment.

FIG. 9 is a timing chart showing a first example of a write operation accompanied by a read operation in the memory device according to the modification of the first embodiment. FIG. 10 is a timing chart showing a second example of a write operation accompanied by a read operation in the memory device according to the modification of the first embodiment. FIG. 11 is a timing chart showing a third example of a write operation accompanied by a read operation in the memory device according to the modification of the first embodiment. The first example corresponds to a case where the read data is the same as the data to be written. The second example corresponds to a case where the read data differs from the data to be written and the polarity of a write pulse is the same as the polarity of a read pulse. The third example corresponds to a case where the read data differs from the data to be written and the polarity of a write pulse differs from the polarity of the read pulse.

In each of the first to third examples, a read current Ir is first of all applied to a selected memory cell MC over a period Dr.

In the first example, the same data as the data to be written has already been stored in the selected memory cell MC. In other words, it is unnecessary to apply a write pulse. For this reason, after the period Dr, a current Irec_r is applied to the selected memory cell MC over a period Drec_r. Furthermore, a write pulse, and a recovery pulse subsequent to the write pulse are omitted.

In the second example, it is assumed that, for example, the read data is "1" whereas the data to be written is "0". In other words, in the second example, a write pulse having a positive polarity, which is the same as the polarity of the read pulse, is applied to the selected memory cell MC. For this reason, after the period Dr, a current Irec_r is applied to the selected memory cell MC over a period Drec_r. After the period Drec_r, a write current Iw0 is applied to the selected memory cell MC over the period Dw0 and thereafter a current Irec_w0 is applied over the period Drec_w0.

In the third example, it is assumed that, for example, the read data is "0" whereas the data to be written is "1". In other words, in the third example, a write pulse having a negative polarity, which is different from the polarity of the read pulse, is applied to the selected memory cell MC. For this reason, a recovery pulse subsequent to a read pulse and a recovery pulse subsequent to a write pulse are omitted. Thereafter, after the period Dr, a write current Iw1 is applied to the selected memory cell MC over a period Dw1.

1.4.3 Advantageous Effects of Modification of First Embodiment

According to the modification of the first embodiment, the memory device 2 performs a read operation prior to a write operation. It is thereby possible to omit an unnecessary write operation. In a case where a write operation is required, when the polarity of a read pulse and that of a write pulse are mutually different, the memory device 2 omits a recovery pulse slated between the read pulse and the write pulse (namely, a recovery pulse subsequent to the read pulse) and a recovery pulse subsequent to the write pulse. It is thereby possible to omit unnecessary recovery operations and to prevent consecutive pulses of the same polarity over a sequence of read operations and write operations. For this reason, it is possible to prevent degradation of endurance of the switching elements.

2. Second Embodiment

Next, a second embodiment will be described. The second embodiment differs from the first embodiment in the order of performing the recovery pulse, the write pulse, and the read pulse. In the following description, the configurations and operations different from the first embodiment will be described. Descriptions of configurations and operations similar to those of the first embodiment will be omitted.

2.1 Flowchart

Figure 12:
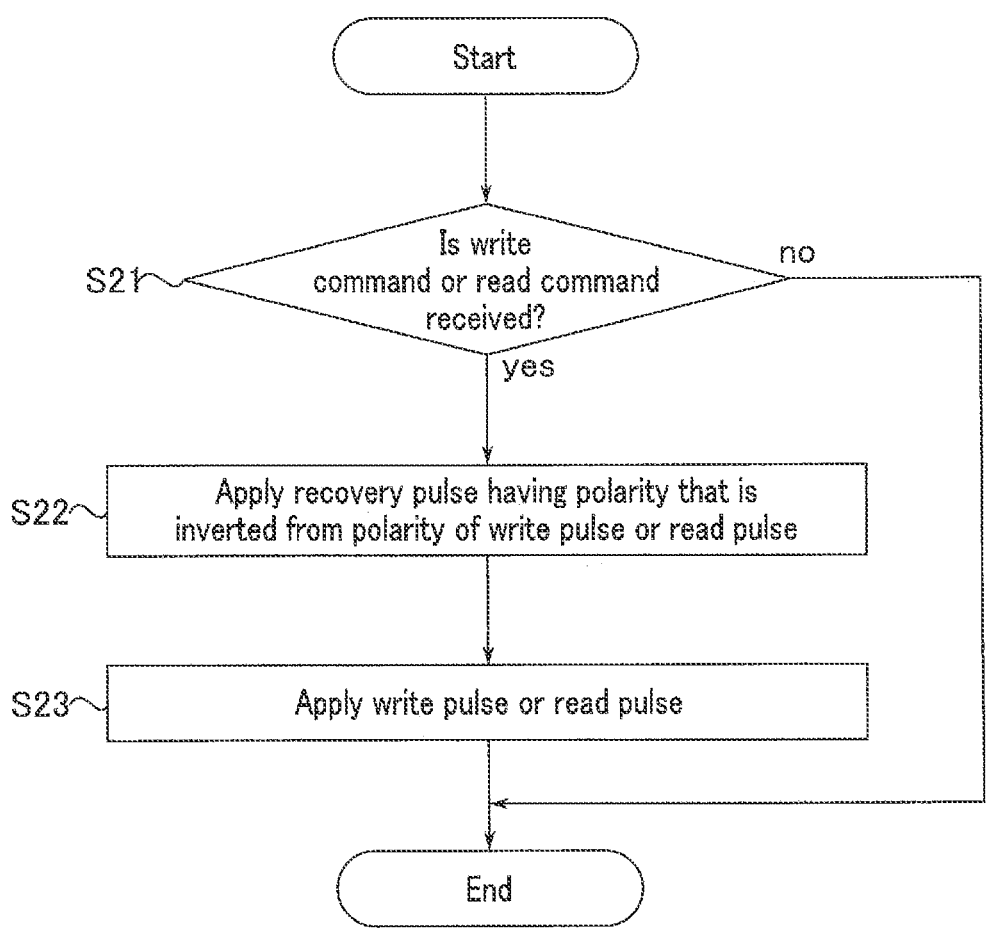
FIG. 12 is a flowchart showing an example of a series of operations in a memory device according to a second embodiment.

FIG. 12 is a flowchart showing an example of a series of operations in the memory device according to the second embodiment. FIG. 12 corresponds to FIG. 4 in the first embodiment.

When a command is received from the memory controller 3 ("Start"), the control circuit 18 determines whether or not the received command is a write command or a read command (S21).

If the received command is either a write command or a read command (Yes in S21), the row selection circuit 11 and the column selection circuit 12 apply a recovery pulse having the polarity that is inverted from the polarity of the write pulse or the read pulse to the selected memory cell MC (S22). Specifically, if the received command is a write command, the row selection circuit 11 and the column selection circuit 12 apply to the selected memory cell MC a recovery pulse having the polarity that is inverted from the polarity of the write pulse to be applied in response to the write command. If the received command is a read command, the row selection circuit 11 and the column selection circuit 12 apply to the selected memory cell MC a recovery pulse having the polarity that is inverted from the polarity of the read pulse to be applied in response to the read command.

After the process in S22, the row selection circuit 11 and the column selection circuit 12 apply either a write pulse or a read pulse to the selected memory cell MC (S23). Specifically, if the received command is a write command, the row selection circuit 11 and the column selection circuit 12 apply a write pulse to the selected memory cell MC. If the received command is a read command, the row selection circuit 11 and the column selection circuit 12 apply a read pulse to the selected memory cell MC.

After the process in S23, or if the received command is neither a write command nor a read command (No in S21), the series of operations in the memory device 2 is finished ("End").

2.2 Timing Chart

Figure 13:
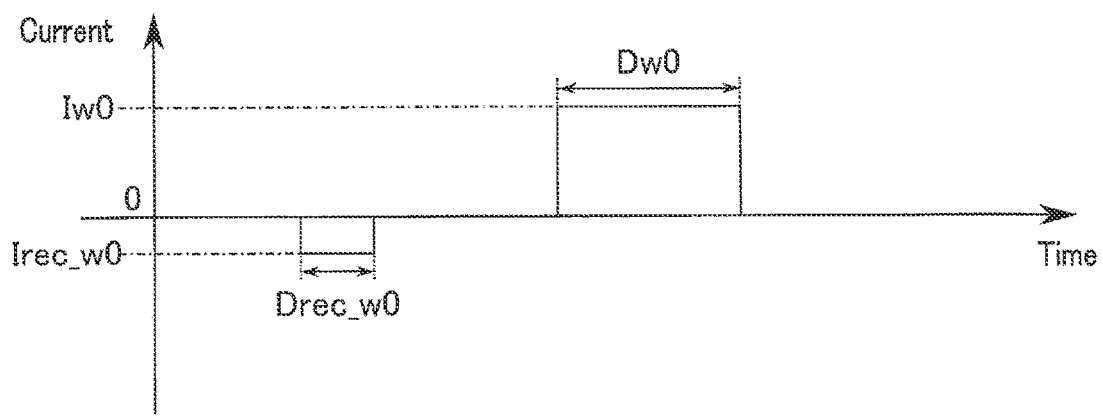
FIG. 13 is a timing chart showing an example of a write operation in the memory device according to the second embodiment.
Figure 14:
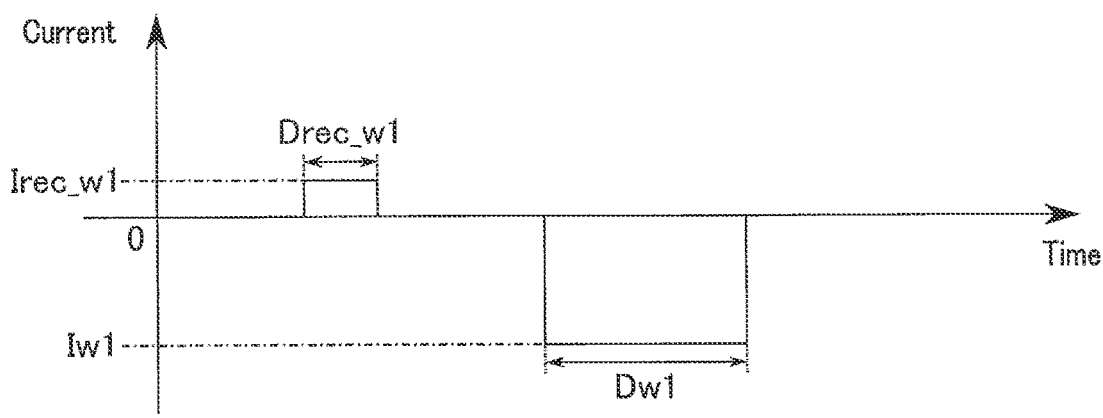
FIG. 14 is a timing chart showing an example of a write operation in the memory device according to the second embodiment.
Figure 15:
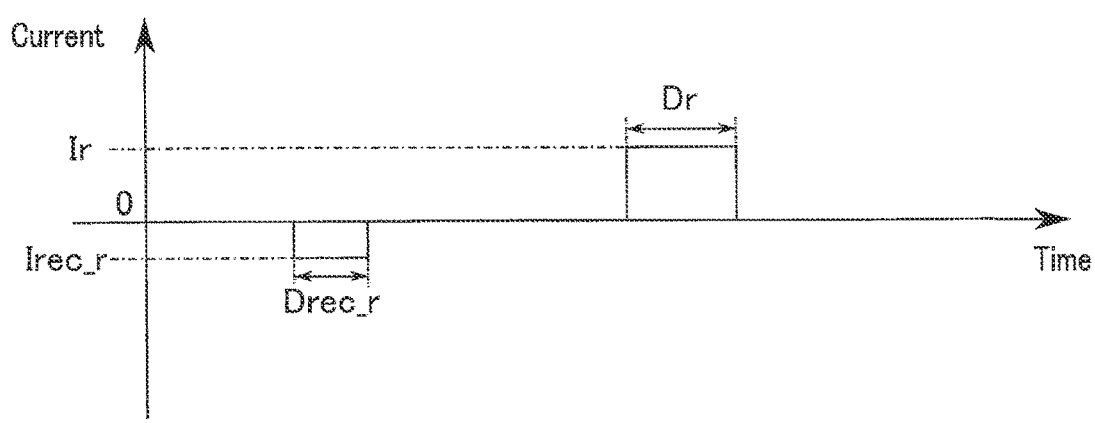
FIG. 15 is a timing chart showing an example of a read operation in the memory device according to the second embodiment.

Each of FIGS. 13 and 14 is a timing chart showing an example of a write operation in the memory device according to the second embodiment. FIG. 15 is a timing chart showing an example of a read operation in the memory device according to the second embodiment. FIGS. 13 to 15 correspond to FIGS. 5-7 regarding the first embodiment.

When data "0" is written, a current Irec_w0 is applied to the selected memory cell MC over the period Drec_w0 and thereafter a write current Iw0 is applied over the period Dw0.

When data "1" is written, a current Irec_w1 is applied to the selected memory cell MC over the period Drec_w1 and thereafter a write current Iw1 is applied over the period Dw1.

When the data is read, a current Irec_r is applied to the selected memory cell MC over the period Drec_r and thereafter a read current Ir is applied over the period Dr.

2.3 Advantageous Effects of Second Embodiment

According to the second embodiment, the memory device 2 alternately applies the currents Irec_w0 and Iw0 having different polarities in this order to a selected memory cell MC in a write operation for data "0". The memory device 2 alternately applies the currents Irec_w1 and Iw1 having different polarities in this order to a selected memory cell MC in a write operation for data "1". The memory device 2 alternately applies the currents Irec_r and Ir having different polarities in this order to a selected memory cell MC in a read operation. Similarly to the first embodiment, it is thereby possible to alternately turn the switching element SW in a selected memory cell MC to an on state with two signals having different polarities every time a write operation and a read operation are performed. Thus, it is possible to prevent degradation of endurance of the switching elements SW.

2.4 Modifications of Second Embodiment

In the foregoing second embodiment, a case where a recovery pulse is applied in every write operation and read operation is explained; however, the second embodiment is not limited thereto. For example, similarly to the modification of the first embodiment, if the order of performing a write operation and a read operation is known in advance, an application of a recovery pulse may be omitted.

2.4.1 Flowchart

Figure 16:
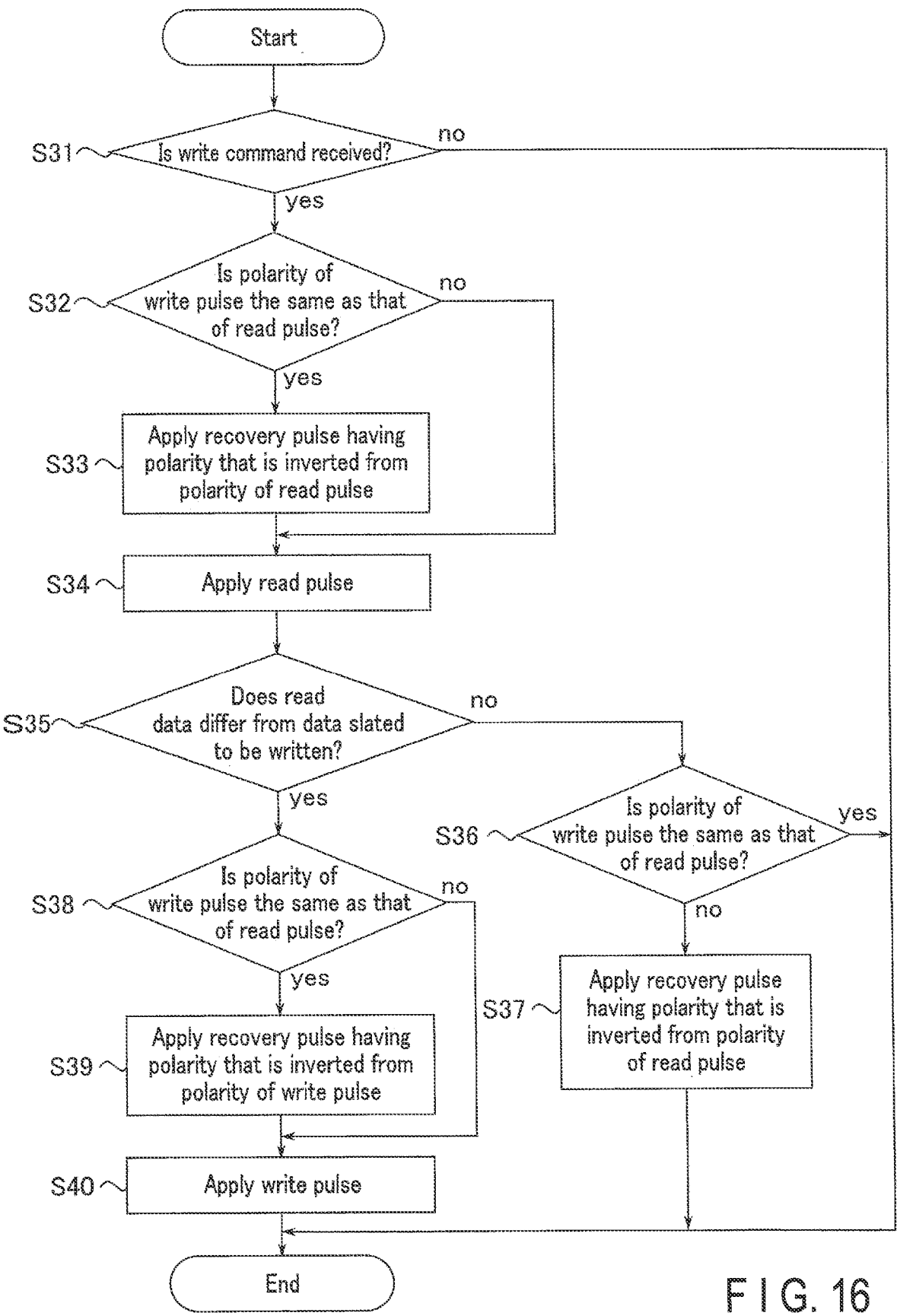
FIG. 16 is a flowchart showing an example of a series of operations in a memory device according to a modification of the second embodiment.

FIG. 16 is a flowchart showing an example of a series of operations in the memory device according to a modification of the second embodiment. FIG. 16 corresponds to FIG. 8 in the modification of the first embodiment.

When a command is received from the memory controller 3 ("Start"), the control circuit 18 determines whether or not the received command is a write command (S31).

If the received command is not a write command (No in S31), the series of operations in the memory device 2 is finished ("End").

If the received command is a write command (Yes in S31), the control circuit 18 determines whether or not the polarity of the write pulse corresponding to the data to be written is the same as the polarity of the read pulse corresponding to the read data (S32).

If the polarity of the write pulse is the same as the polarity of the read pulse (Yes in S32), the row selection circuit 11 and the column selection circuit 12 apply to the selected memory cell MC a recovery pulse having a polarity that is inverted from the polarity of the read pulse (S33).

If the polarity of the write pulse differs from the polarity of the read pulse (No in S32), or after the process in S33, the row selection circuit 11 and the column selection circuit 12 apply a read pulse to the selected memory cell MC (S34).

The read circuit 15 reads data from the selected memory cell MC based on the read pulse applied in the process in S34. The control circuit 18 determines whether or not the read data differs from the data to be written by the received write command (S35).

If the read data matches the data to be written (No in S35), the control circuit 18 determines whether or not the polarity of the write pulse corresponding to the data to be written is the same as the polarity of the read pulse corresponding to the read data (S36).

If the polarity of the write pulse is the same as the polarity of the read pulse (Yes in S36), the series of operations in the memory device 2 is finished ("End").

If the polarity of the write pulse differs from the polarity of the read pulse (No in S36), the row selection circuit 11 and the column selection circuit 12 apply to the selected memory cell MC a recovery pulse having a polarity that is inverted from the polarity of the read pulse (S37). After the process in S37, the series of operations in the memory device 2 is finished ("End").

If the read data differs from the data to be written (Yes in S35), the control circuit 18 determines whether or not the polarity of the write pulse corresponding to the data to be written is the same as the polarity of the read pulse corresponding to the read data (S38).

If the polarity of the write pulse is the same as the polarity of the read pulse (Yes in S38), the row selection circuit 11 and the column selection circuit 12 apply a recovery pulse having a polarity that is inverted from the polarity of the write pulse (S39).

If the polarity the write pulse differs from the polarity of the read pulse (No in S38), or after the process in S39, the row selection circuit 11 and the column selection circuit 12 apply a write pulse to the selected memory cell MC (S40).

After the process in S40, the series of operations in the memory device 2 is finished ("End").

2.4.2 Timing Chart

Figure 17:
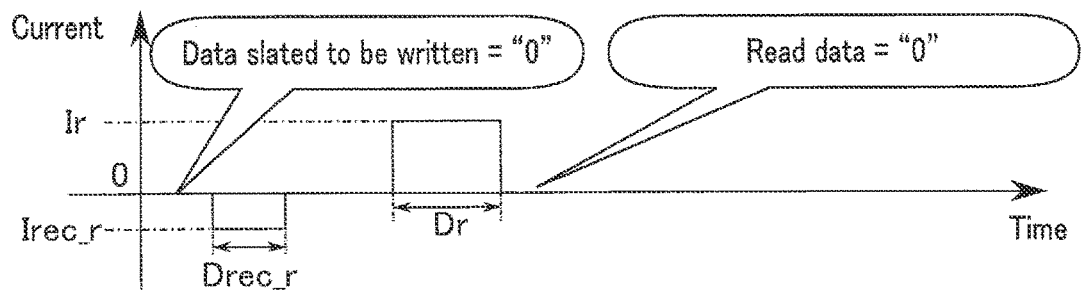
FIG. 17 is a timing chart showing a first example of a write operation accompanied by a read operation in the memory device according to the modification of the second embodiment.
Figure 18:
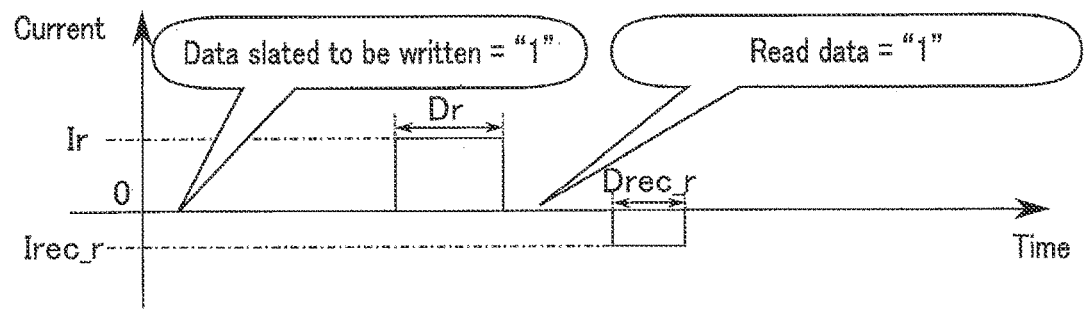
FIG. 18 is a timing chart showing a second example of a write operation accompanied by a read operation in the memory device according to the modification of the second embodiment.
Figure 19:
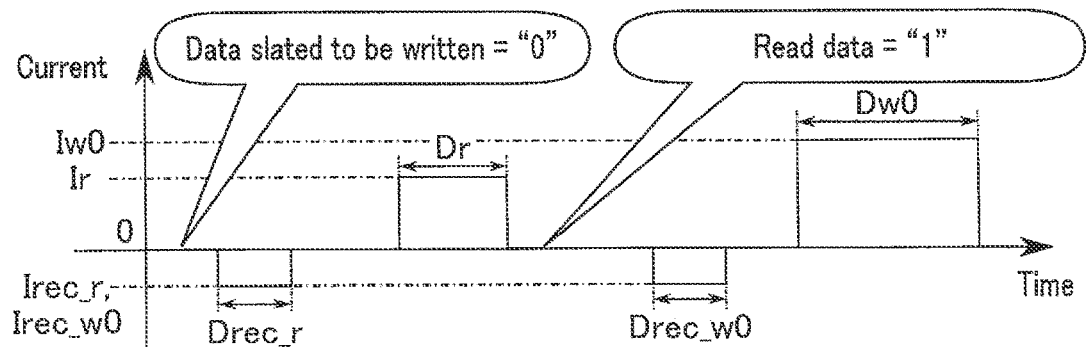
FIG. 19 is a timing chart showing a third example of a write operation accompanied by a read operation in the memory device according to the modification of the second embodiment.
Figure 20:
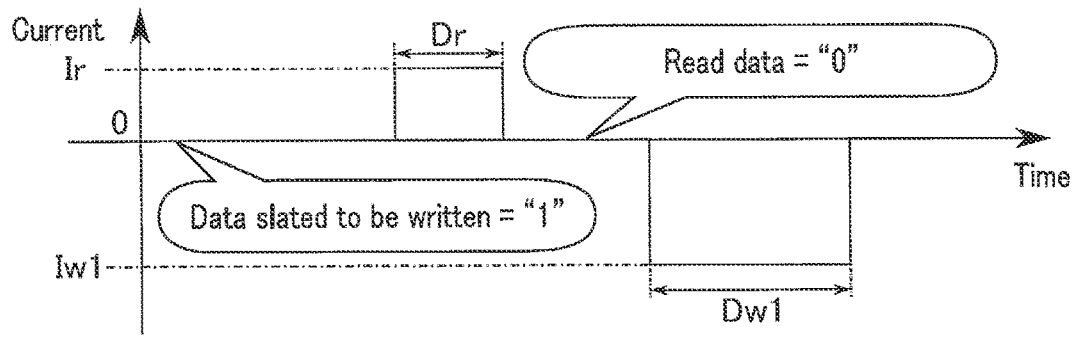
FIG. 20 is a timing chart showing a fourth example of a write operation accompanied by a read operation in the memory device according to the modification of the second embodiment.

FIG. 17 is a timing chart showing a first example of a write operation accompanied by a read operation in the memory device according to the modification of the second embodiment. FIG. 18 is a timing chart showing a second example of a write operation accompanied by a read operation in the memory device according to the modification of the second embodiment. FIG. 19 is a timing chart showing a third example of a write operation accompanied by a read operation in the memory device according to the modification of the second embodiment. FIG. 20 is a timing chart showing a fourth example of a write operation accompanied by a read operation in the memory device according to the modification of the second embodiment. FIGS. 17 and 18 correspond to FIG. 9 in the modification of the first embodiment. FIGS. 19 and 20 correspond to FIGS. 10 and 11 in the modification of the first embodiment.

In any one of the first to fourth examples, it is first determined whether or not the polarity of the read pulse matches the polarity of the write pulse.

In the first and third examples, it is assumed that data to be written is "0". In other words, in the first and third examples, the polarity of the write pulse to be applied to the selected memory cell MC matches the polarity of the read pulse to be applied. For this reason, after a current Irec_r is applied over the period Drec_r, a read current Ir is applied to a selected memory cell MC over a period Dr.

In the second and fourth examples, it is assumed that data to be written is "1". In other words, in the second and fourth examples, the polarity of the write pulse to be applied to the selected memory cell MC differs from the polarity of the read pulse to be applied. For this reason, a recovery pulse that precedes a read pulse is omitted. Thereafter, a read current Ir is applied to the selected memory cell MC over a period Dr.

After the read pulse is applied, it is determined whether or not the read data differs from the data to be written in response to the received write command.

In the first example, the data "0" same as the data to be written has already been stored in the selected memory cell MC. In other words, it is unnecessary to apply a write pulse. For this reason, after the period Dr, the recovery pulse that precedes the write pulse and the write pulse are omitted.

In the second example, the same data as the data "1" to be written has already been stored in the selected memory cell MC. In other words, while the application of a write pulse is unnecessary, an application of a recovery pulse corresponding to a read pulse is requested. For this reason, after the period Dr, the recovery pulse that precedes the write pulse and the write pulse are omitted. Thereafter, a current Irec_r is applied to a selected memory cell MC over a period Drec_r.

In the third example, it is assumed that, for example, the read data is "1" whereas the data to be written is "0". In other words, in the third example, a write pulse having a positive polarity, which is the same as the polarity of the read pulse, is applied to the selected memory cell MC. For this reason, after the period Dr, a current Irec_w0 is applied to the selected memory cell MC over the period Drec_w0 and thereafter a write current Iw0 is applied over the period Dw0.

In the fourth example, it is assumed that, for example, the read data is "0" whereas the data to be written is "1". In other words, in the fourth example, a write pulse having a negative polarity, which is different from the polarity of the read pulse, is applied to the selected memory cell MC. For this reason, a recovery pulse that precedes a write pulse is omitted. Thereafter, after the period Dr, a write current Iw1 is applied to a selected memory cell MC over a period Dw1.

2.4.3 Advantageous Effects of Modifications of Second Embodiment

According to the modification of the second embodiment, the memory device 2 performs a read operation prior to a write operation. It is thereby possible to omit an unnecessary write operation. When the polarity of a read pulse and that of a write pulse are mutually different, the memory device 2 omits a recovery pulse that precedes the read pulse and a recovery pulse slated between the read pulse and the write pulse (namely, a recovery pulse that precedes the write pulse). It is thereby possible to omit an unnecessary recovery operation and to prevent consecutive pulses of the same polarity over a series of read operations and write operations. For this reason, it is possible to prevent degradation of endurance of the switching elements SW.

3. Third Embodiment

Next, a third embodiment will be described. The third embodiment differs from the first embodiment in that a recovery pulse corresponding to a write pulse for writing data "1" is applied prior to the write pulse. In the following description, the configurations and operations different from the first embodiment and the second embodiment will be described. Descriptions of configurations and operations similar to those of the first embodiment and the second embodiment will be omitted.

3.1 Flowchart

Figure 21:
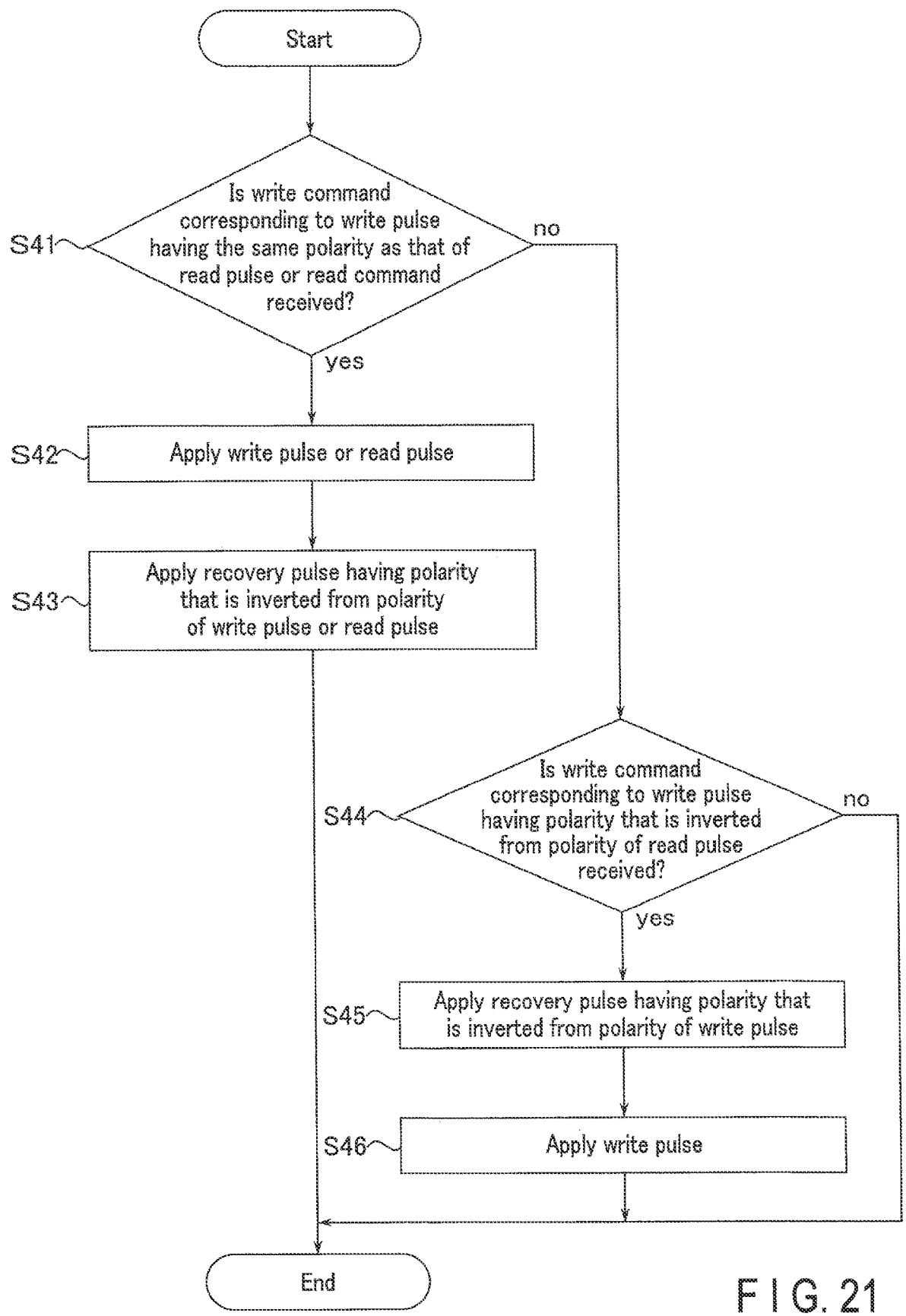
FIG. 21 is a flowchart showing an example of a series of operations in a memory device according to a third embodiment.

FIG. 21 is a flowchart showing an example of a series of operations in the memory device according to the third embodiment. FIG. 21 corresponds to FIG. 4 in the first embodiment.

When a command is received from the memory controller 3 ("Start"), the control circuit 18 determines whether or not the received command is a write command that satisfies a condition A or a read command (S41). The condition A is that a write command corresponds to a write pulse having the same polarity as the polarity of a read pulse.

If the received command is either a write command that satisfies the condition A or a read command (Yes in S41), the row selection circuit 11 and the column selection circuit 12 apply either a write pulse or a read pulse to a selected memory cell MC (S42).

After the process in S42, the row selection circuit 11 and the column selection circuit 12 apply a recovery pulse having a polarity that is inverted from the polarity of the write pulse or the reads pulse to the selected memory cell MC (S43).

If the received command is neither a write command that satisfies the condition A nor a read command (No in S41), the control circuit 18 determines whether or not the received command is a write command that satisfies a condition B (S44). The condition B is that a write command corresponds to a write pulse having the polarity that is inverted from the polarity of a read pulse.

If the received command is a write command that satisfies the condition B (Yes in S44), the row selection circuit 11 and the column selection circuit 12 apply a recovery pulse having the polarity that is inverted from the polarity of the write pulse to the selected memory cell MC (S45).

After the process in S45, the row selection circuit 11 and the column selection circuit 12 apply a write pulse to the selected memory cell MC (S46).

After the process in S43, after the process in S46, or if the received command is not a write command that satisfies the condition B (No in S44), the series of operations in the memory device 2 is finished ("End").

3.2 Advantageous Effects of Third Embodiment

According to the second embodiment, the memory device 3 alternately applies the currents Iw0 and Irec_w0 having different polarities in this order to a selected memory cell MC in a write operation for data "0". The memory device 2 alternately applies the currents Irec_w1 and Iw1 having different polarities in this order to a selected memory cell MC in a write operation for data "1". The memory device 2 alternately applies the currents Ir and Irec_r having different polarities in this order to a selected memory cell MC in a read operation. It is thereby possible to alternately turn the switching element SW in a selected memory cell MC to an on state with two signals having different polarities every time a write operation and a read operation are performed. In addition, it is thereby possible to alternately turn the switching element SW in a selected memory cell MC to an on state with two signals having different polarities, even when a write operation or a read operation for data "0" and a write operation for data "1" are successively performed. Thus, it is possible to prevent degradation of endurance of the switching elements SW.

4. Fourth Embodiment

Next, a fourth embodiment will be described. The fourth embodiment differs from the third embodiment in the order of performing the recovery pulse and either of the write pulse and the read pulse. In the following description, the configurations and operations different from the third embodiment will be described. Descriptions of configurations and operations similar to those of the third embodiment will be omitted.

4.1 Flowchart

Figure 22:
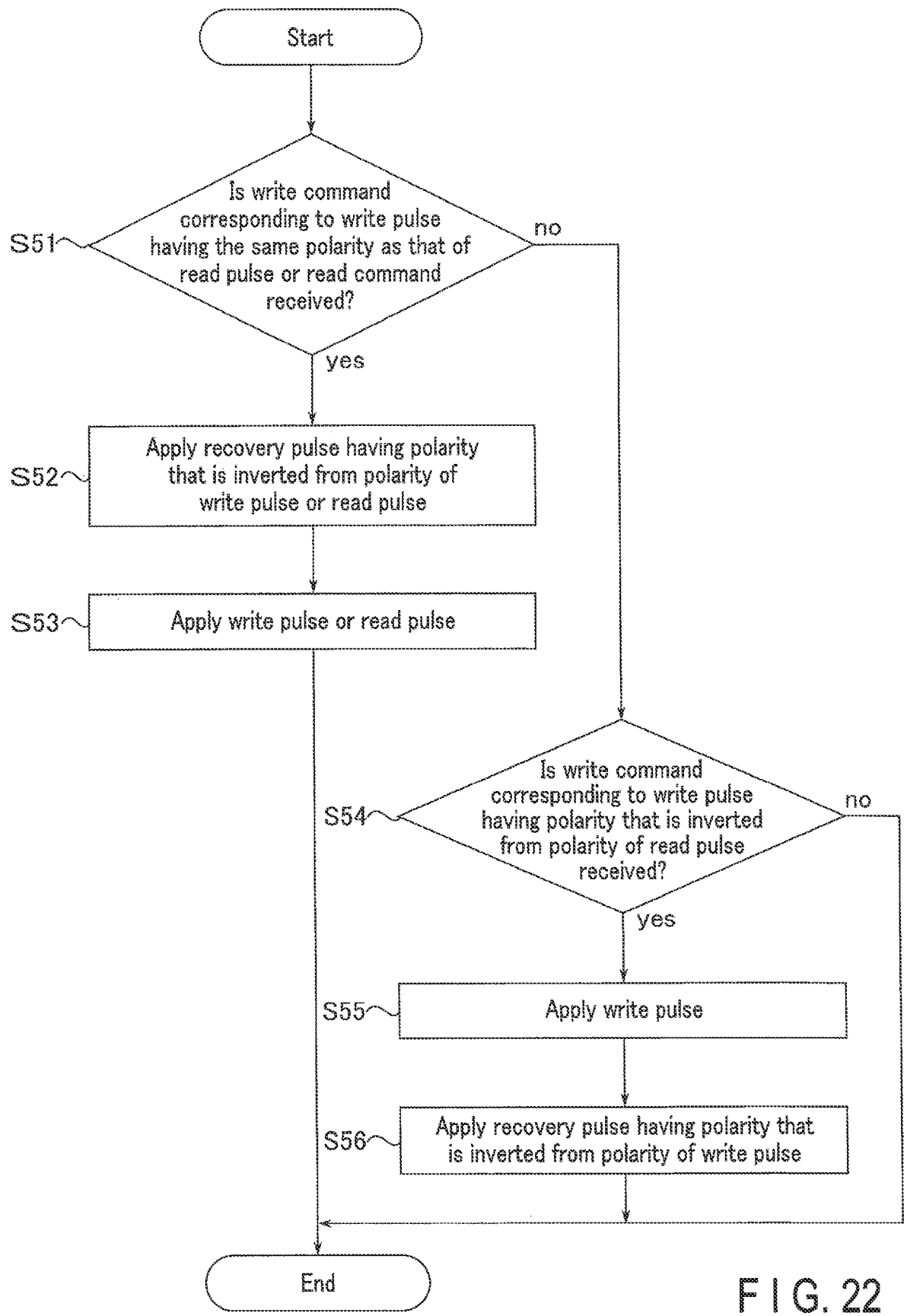
FIG. 22 is a flowchart showing an example of a series of operations in a memory device according to a fourth embodiment.

FIG. 22 is a flowchart showing an example of a series of operations in the memory device according to the fourth embodiment. FIG. 22 corresponds to FIG. 21 in the third embodiment.

When a command is received from the memory controller 3 ("Start"), the control circuit 18 determines whether or not the received command is either a write command that satisfies the condition A or a read command (S51).

If the received command is a write command that satisfies the condition A or a read command (Yes in S51), the row selection circuit 11 and the column selection circuit 12 apply a recovery pulse having the polarity that is inverted from the polarity of the write pulse or the read pulse to a selected memory cell MC (S52).

After the process in S52, the row selection circuit 11 and the column selection circuit 12 apply either a write pulse or a read pulse to the selected memory cell MC (S53).

If the received command is neither a write command that satisfies the condition A nor a read command (No in S51), the control circuit 18 determines whether or not the received command is a write command that satisfies the condition B (S54).

If the received command is a write command that satisfies the condition B (Yes in S54), the row selection circuit 11 and the column selection circuit 12 apply a write pulse to the selected memory cell MC (S55).

After the process in S55, the row selection circuit 11 and the column selection circuit 12 apply a recovery pulse having a polarity that is inverted from the polarity of the write pulse to the selected memory cell MC (S56).

After the process in S53, after the process in S56, or if the received command is not a write command that satisfies the condition B (No in S54), the series of operations in the memory device 2 is finished ("End").

4.2 Advantageous Effects of Fourth Embodiment

According to the second embodiment, the memory device 4 alternately applies the currents Irec_w0 and Iw0 having different polarities in this order to a selected memory cell MC in a write operation for data "0". The memory device 2 alternately applies the currents Iw1 and Irec_w1 having different polarities in this order to a selected memory cell MC in a write operation for data "1". The memory device 2 alternately applies the currents Irec_r and Ir having different polarities in this order to a selected memory cell MC in a read operation. Thus, similarly to the third embodiment, it is thereby possible to alternately turn the switching element SW in a selected memory cell MC to an on state with two signals having different polarities, even when a write operation or a read operation for data "0" and a write operation for data "1" are successively performed. Thus, it is possible to prevent degradation of endurance of the switching elements SW.

5. Fifth Embodiment

Next, a fifth embodiment will be described. The fifth embodiment differs from the first through fourth embodiments in the application of a recovery pulse in an operation other than a write operation and a read operation. In the following description, the configurations and operations different from the first through fourth embodiments will be described. Descriptions of configurations and operations similar to those of the first through fourth embodiments will be omitted.

5.1 Configuration of Memory Controller

Figure 23:
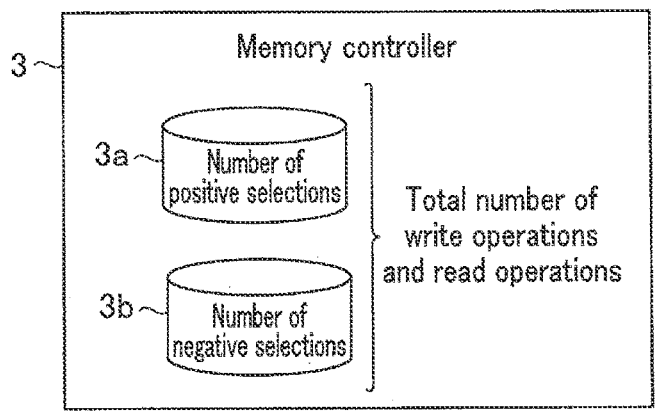
FIG. 23 is a block diagram showing a configuration example of a memory controller according to a fifth embodiment.

FIG. 23 is a block diagram showing a configuration example of a memory controller according to the fifth embodiment. The memory controller 3 stores the number of positive selections 3a and the number of negative selections 3b.

The number of positive selections 3a is the number of times a pulse having a positive polarity is used when a plurality of memory cells MC in the memory cell array 10 are selected. Specifically, the number of positive selections 3a is a total number of write operations and read operations for data "0".

The number of negative selections 3b is the number of times a pulse having a negative polarity is used when a plurality of memory cells MC in the memory cell array 10 are selected. Specifically, the number of negative selections 3b is a total number of write operations for data "1".

The memory controller 3 manages the number of positive selections 3a and the number of negative selections 3b for each predetermined memory area in the memory cell array 10. It is thereby possible for the memory controller 3 to know whether the number of positive pulses and that of negative pulses used for turning the switching element SW to an on state are in balance.

A sum of the number of positive selections 3a and the number of negative selections 3b is a total number of write operations and read operations. It is thereby possible for the memory controller 3 to know a total number of times the switching elements SW are turned to an on state.

5.2 Operations of Memory Controller (Flowchart)

Figure 24:
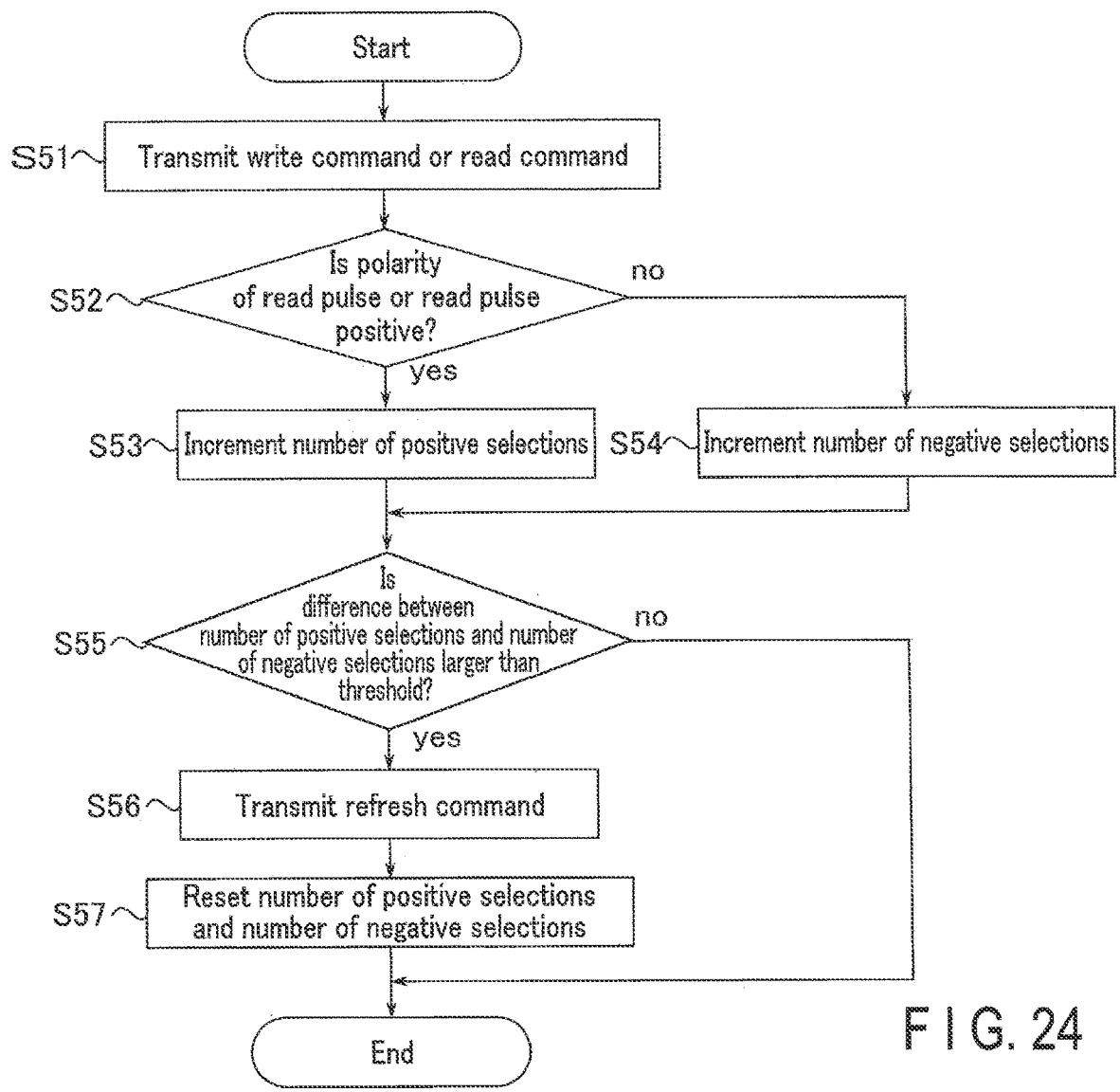
FIG. 24 is a flowchart showing an example of a series of operations in the memory controller according to the fifth embodiment.

FIG. 24 is a flowchart showing an example of a series of operations in the memory controller according to the fifth embodiment.

A request for writing data or a request for reading data is received from the external host device ("Start"), and the memory controller 3 transmits a write command or a read command to the memory device 2 (S51).

The memory controller 3 determines whether or not the polarity of a write pulse that corresponds to a write command or a read pulse that corresponds to a read command is positive (S52).

If the polarity of the write pulse or the read pulse is positive (Yes in S52), the memory controller 3 increments the number of positive selections 3a (S53). Specifically, if a write command that instructs execution of a write operation for data "0" or a read command is transmitted, the memory controller 3 increments the number of positive selections 3a.

If the polarity of the write pulse or the read pulse is negative (Yes in S52), the memory controller 3 increments the number of negative selections 3b (S54). Specifically, if a write command that instructs execution of a write operation for data "1" is transmitted, the memory controller 3 increments the number of negative selections 3b.

After the process in S53 or after the process in S54, the memory controller 3 determines whether or not a difference between the number of positive selections 3a and the number of negative selections 3b is greater than a threshold (S55). The threshold is a positive integer.

If the difference between the number of positive selections 3 and the number of negative selections 3b exceeds the threshold (Yes in S55), the memory controller 3 transmits a refresh command (S56) to the memory device 2. A refresh command is a command that instructs the memory device 2 to perform a refresh operation. A refresh operation is an operation for suppressing degradation of endurance of the switching elements SW due to an imbalance in the number of positive pulses and that of negative pulses used for turning the switching elements SW to an on state.

After the process in S56, the memory controller 3 resets a number of positive selections 3a and a number of negative selections 3b to "0" (S57).

If the difference between the number of positive selections 3a and the number of negative selections 3b is less than the threshold (No in S55), or after the process in S57, the series of operations in the memory controller 3 is finished ("End").

5.3 Operations of Memory Device (Timing Chart)

Figure 25:
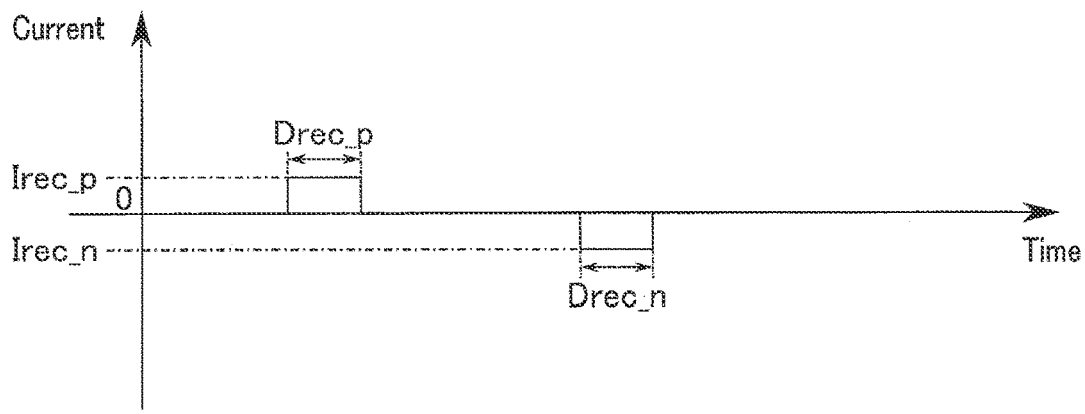
FIG. 25 is a timing chart showing an example of a refresh operation in a memory device according to the fifth embodiment.

FIG. 25 is a timing chart showing an example of a refresh operation in a memory device according to the fifth embodiment. FIG. 25 shows current signals applied to a selected memory cell MC based on a refresh command from the memory controller 3.

Upon receipt of a refresh command, the memory device 2 performs a refresh operation. Specifically, when a voltage Vrec_p (not shown) is applied, the switching element SW in the selected memory cell MC is turned to an on state. Thus, a current Irec_p is applied to the selected memory cell MC over a period Drec_p. Thereafter, when a voltage Vrec_n (not shown) is applied, the switching element SW in the selected memory cell MC is turned to an on state. Thus, a current Irec_n is applied to the selected memory cell MC over a period Drec_n. The period of time between the period Drec_p and the period Drec_n may be set to a discretionarily determined length. The current Irec_p has a positive polarity, whereas the current Irec_n has a negative polarity.

Each of the currents Irec_p and Irec_n is smaller than the write currents Iw0 and Iw1. Each of the currents Irec_p and Irec_n may be smaller than the read current Ir. The currents Irec_p and Irec_n may be mutually equal. The currents Irec_p and Irec_n may be mutually different.

Each of the periods Drec_p and Drec_n is shorter than the periods Dw0 and Dw1. Each of the periods Drec_p and Drec_n may be shorter than the period Dr. The periods Drec_p and Drec_n may be mutually equal. The periods Drec_p and Drec_n may be mutually different.

Each of the voltages Vrec_p and Vrec_n is smaller than the write voltages Vw0 and Vw1. Each of the voltages Vrec_p and Vrec_n may be smaller than the read voltage Vr. The voltages Vrec_p and Vrec_n may be mutually equal. The voltages Vrec_p and Vrec_n may be mutually different.

FIG. 25 shows a case where the current Irec_p is applied over the period Drec_p and thereafter the current Irec_n is applied over the period Drec_n in a refresh operation; however, the embodiment is not limited to this example. For example, the current Irec_n may be applied over the period Drec_n and thereafter the current Irec_p may be applied over the period Drec_p in a refresh operation.

5.4 Advantageous Effects of Fifth Embodiment

According to the fifth embodiment, the memory device 2 performs a refresh operation upon receipt of a refresh command. In the refresh operation, the memory device 2 alternately applies the currents Irec_p and Irec_n having different polarities. It is thereby possible to alternately turn the switching element SW in a selected memory cell MC to an on state with two signals having different polarities, regardless of whether a recovery pulse is applied or not in a write operation and a read operation. For this reason, it is possible to mitigate degradation of characteristics of the switching elements SW due to an imbalance in the number of positive pulses and that of negative pulses that turn the switching elements SW to an on state.

If the difference between the number of positive selections 3a and the number of negative selections 3b is equal to or greater than a threshold, the memory controller 3 transmits a refresh command to the memory device 2. It is thereby possible for the memory controller 3 to instruct the memory device 2 to perform a refresh operation periodically before an imbalance in the number of positive pulses and that of negative pulses that turn the switching element SW to an on state become noticeable. Thus, it is possible to prevent degradation of endurance of the switching elements SW.

5.5 Modifications of Fifth Embodiment

In the foregoing fifth embodiment, a case where whether or not a refresh operation is performed is determined based on a difference between the number of positive selections 3a and the number of negative selections 3b; however, the embodiment is not limited to this case. For example, whether or not a refresh operation is performed may be determined based on a total number of write operations and read operations.

5.5.1. Operations of Memory Controller (Flowchart)

Figure 26:
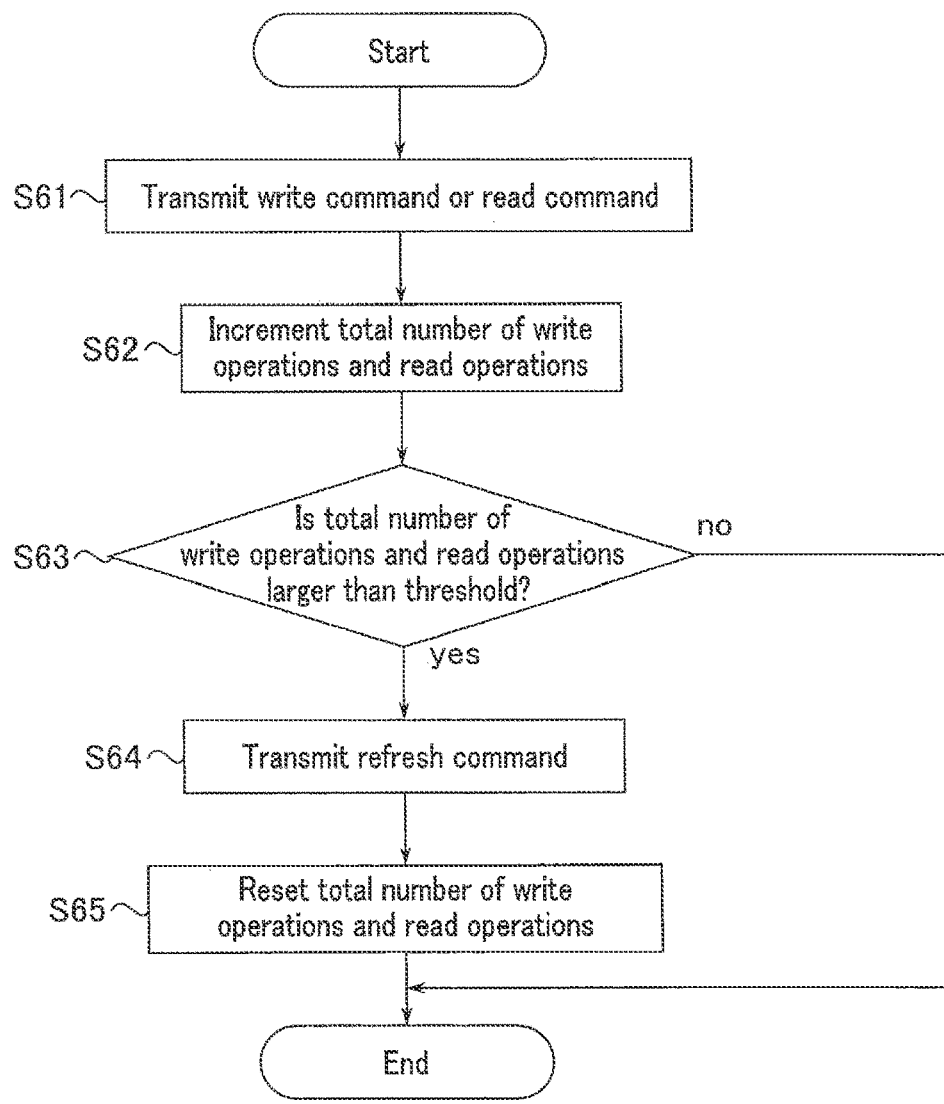
FIG. 26 is a flowchart showing an example of a series of operations in a memory controller according to a modification of the fifth embodiment.

FIG. 26 is a flowchart showing an example of a series of operations in a memory controller according to a modification of the fifth embodiment.

Upon receipt of a request for writing or reading data from the external host device ("Start"), the memory controller 3 transmits a write command or a read command to the memory device 2 (S61).

The memory controller 3 increments a total number of write operations and read operations (S62).

The memory controller 3 determines whether or not the total number of write operations and read operations is equal to or greater than a threshold (S63). The threshold is a positive integer.

If the total number of write operations and read operations exceeds the threshold (Yes in S63), the memory controller 3 transmits a refresh command (S64).

The memory controller 3 resets the total number of write operation and read operations to "0" (S65).

If the total number of write operations and read operations is less than the threshold (No in S63), or after the process in S65, the series of operations in the memory controller 3 is finished ("End").

5.5.2 Advantageous Effects according to Modification of Fifth Embodiment

According to the modification of the fifth embodiment, if the total number of write operations and read operations exceeds the threshold, the memory controller 3 transmits a refresh command to the memory device 2. Similarly to the fifth embodiment, it is thereby possible for the memory controller 3 to instruct the memory device 2 to periodically perform a refresh operation before an imbalance in the number of positive pulses and that of negative pulses that turn the switching element SW to an on state becomes noticeable. Thus, it is possible to prevent degradation of endurance of the switching elements SW.

6. Others

In the foregoing first to fifth embodiments, a case is described in which a recovery pulse is applied to a magnetic memory device, such as an MRAM; however, the embodiments are not limited to this case. For example, a recovery pulse is applicable to a resistance change memory similar to an MRAM, for example a phase-change random access memory (PCRAM) and a resistive random access memory (ReRAM).

In a resistance change memory, such as a PCRAM or a ReRAM, the polarity of a pulse applied to a resistance change element SE at the time of a write operation does not change depending on the data. In the following, a case in which a recovery pulse is applied to a PCRAM will be described as an example.

Figure 27:
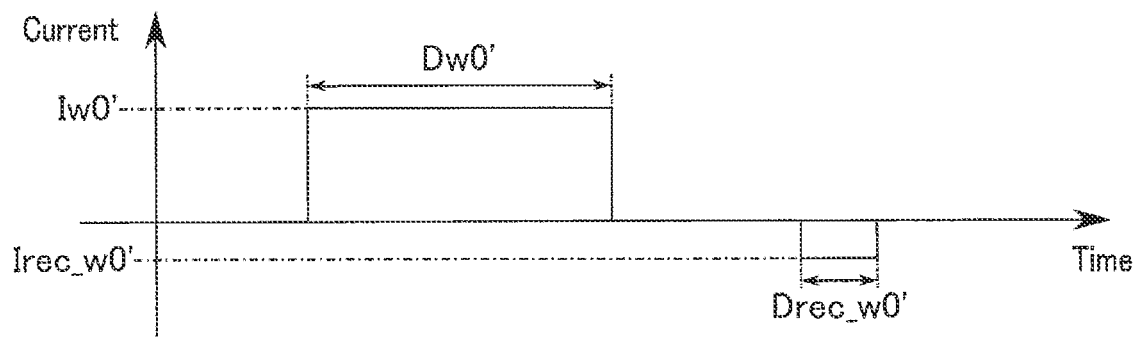
FIG. 27 is a timing chart showing an example of a write operation in the memory device according to another modification.
Figure 28:
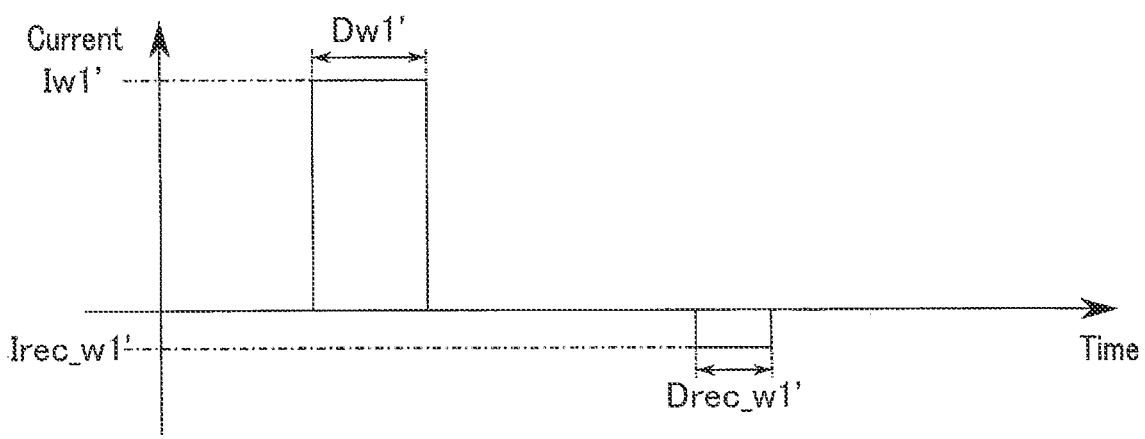
FIG. 28 is a timing chart showing an example of a write operation in a memory device according to another modification.

A recovery pulse may be applied in the order with respect to a write pulse described in the first embodiment. FIGS. 27 and 28 are a timing chart showing an example of a write operation in the memory device according to another modification. FIGS. 27 and 28 correspond to FIGS. 5 and 6 in the first embodiment.

When data "0" is written, the switching element SW in the selected memory cell MC is turned to an on state when a write voltage Vw0' (not shown) is applied. Thus, a write current Iw0' is applied to the selected memory cell MC over a period Dw0'. Thereafter, when a voltage Vrec_w0' (not shown) is applied, the switching element SW in the selected memory cell MC is turned to an on state. Thus, a current Irec_w0' is applied to the selected memory cell MC over a period Drec_w0'. The period of time between the period Dw0' and the period Drec_w0' may be set to a discretionarily determined length. The write current Iw0' has a positive polarity, whereas the current Irec_w0' has a negative polarity.

When data "1" is written, the switching element SW in the selected memory cell MC is turned to an on state when a write voltage Vw1' (not shown) is applied. Thus, a write current Iw1' is applied to the selected memory cell MC over a period Dw1'. Thereafter, when a voltage Vrec_w1' (not shown) is applied, the switching element SW in the selected memory cell MC is turned to an on state. Thus, a current Irec_w1' is applied to the selected memory cell MC over a period Drec_w1'. The period of time between the period Dw1' and the period Drec_w1' may be set to a discretionarily determined length. The write current Iw1' is larger than the write current Iw0' and has the same polarity as the polarity of the write current Iw0'. The period Dw1' is longer than the period Dw0'. The write current Iw1' has a positive polarity, whereas the current Irec_w1' has a negative polarity.

The operation when the data is read is the same as in FIG. 7 of the first embodiment.

Figure 29:
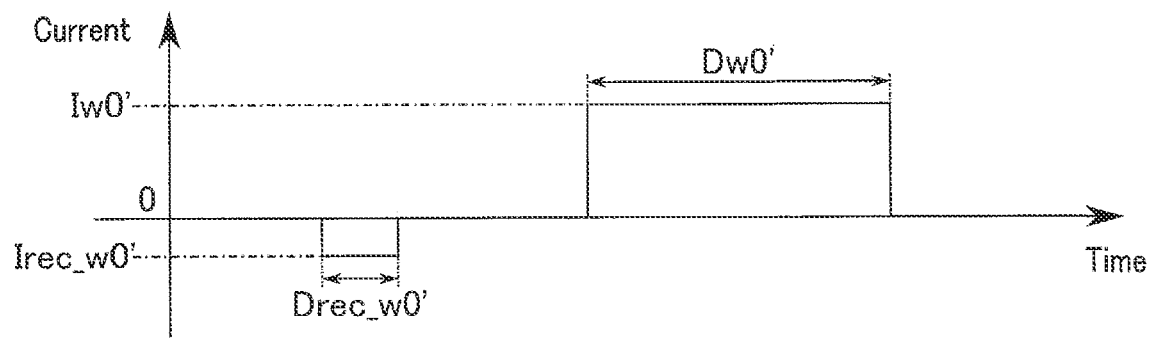
FIG. 29 is a timing chart showing an example of a write operation in a memory device according to another modification.
Figure 30:
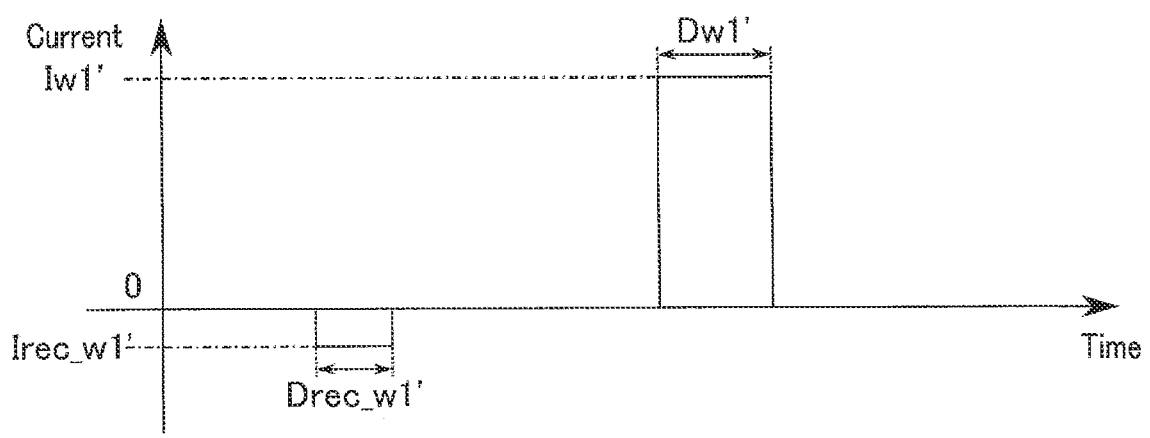
FIG. 30 is a timing chart showing an example of a write operation in a memory device according to another modification.

A recovery pulse may be applied in the order described in the second embodiment in relation to a write pulse. FIGS. 29 and 30 are a timing chart showing an example of a write operation in the memory device according to another modification. FIGS. 29 and 30 correspond to FIGS. 13 and 14 in the second embodiment.

When data "0" is written, a current Irec_w0' is applied to the selected memory cell MC over the period Drec_w0' and thereafter a write current Iw0' is applied over the period Dw0'.

When data "1" is written, a current Irec_w1' is applied to the selected memory cell MC over the period Drec_w1' and thereafter a write current Iw1' is applied over the period Dw1'.

In this case, the operation to read the data is the same as that in FIG. 14 of the second embodiment.

Each of the currents Irec_w0' and Irec_w1' is smaller than the write currents Iw0' and Iw1'. Each of the currents Irec_w0' and Irec_w1' may be smaller than the read current Ir. The currents Irec_w0' and Irec_w1' may be mutually equal. The currents Irec_w0' and Irec_w1' may be mutually different.

Each of the periods Drec_w0' and Drec_w1' is shorter than the periods Dw0' and Dw1'. Each of the periods Drec_w0' and Drec_w1' may be shorter than the period Dr. The periods Drec_w0' and Drec_w1' may be mutually equal. The periods Drec_w0' and Drec_w1' may be mutually different.

Each of the voltages Vrec_w0' and Vrec_w1' is smaller than the write voltages Vw0' and Vw1'. Each of the voltages Vrec_w0' and Vrec_w1' may be smaller than the read voltage Vr. The voltages Vrec_w0' and Vrec_w1' may be mutually equal. The voltages Vrec_w0' and Vrec_w1' may be mutually different.

The above-described operations allow a recovery pulse to be applied to resistance change memory devices other than MRAM.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

The invention claimed is:

1. A method executed by a memory device to control operation of the memory device, the memory device including a memory cell that includes a resistance change element and a switching element that are coupled in series, and the method comprising:
performing a first operation to bring the resistance change element to a first resistance value based on a first current;
performing a second operation to bring the resistance change element to a second resistance value different from the first resistance value based on a second current;
performing a third operation to determine whether the resistance change element is at the first resistance value or the second resistance value based on a third current; and
passing two currents having different polarities alternately in the memory cell in each of the first operation, the second operation, and the third operation,
wherein:
the passing the two currents in the first operation includes alternately passing, in the memory cell, the first current and a fourth current having a polarity different from a polarity of the first current,
the passing the two currents in the second operation includes alternately passing, in the memory cell, the second current and a fifth current having a polarity different from a polarity of the second current,
the passing the two currents in the third operation includes alternately passing, in the memory cell, the third current and a sixth current having a polarity different from a polarity of the third current in the third operation, and
each of the first current and the second current is a write pulse, the third current is a read pulse, and each of the fourth current, the fifth current, and the sixth current is a recovery pulse.

2. The method according to claim 1, wherein each of the fourth current, the fifth current, and the sixth current is smaller than the first current and the second current.

3. The method according to claim 2, wherein each of the fourth current, the fifth current, and the sixth current is smaller than the third current.

4. The method according to claim 1, wherein each of a fourth period during which the fourth current flows, a fifth period during which the fifth current flows, and a sixth period during which the sixth current flows is shorter than a first period during which the first current flows and a second period during which the second current flows.

5. The method according to claim 4, wherein each of the fourth period, the fifth period, and the sixth period is shorter than a third period during which the third current flows.

6. The method according to claim 1, wherein:
the passing the two currents in the first operation includes passing the fourth current in the memory cell after passing the first current;
the passing the two currents in the second operation includes passing the fifth current in the memory cell after passing the second current; and
the passing the two currents in the third operation includes passing the sixth current in the memory cell after passing the third current.

7. The method according to claim 6, further comprising:
when the polarity of the second current and the polarity of the third current differ from each other and the second operation is subsequent to the third operation, passing the second current in the memory cell after the third current without passing the sixth current.

8. The method according to claim 1, wherein:
the passing the two currents in the first operation includes passing the fourth current in the memory cell before passing the first current;
the passing the two currents in the second operation includes passing the fifth current in the memory cell before passing the second current; and
the passing the two currents in the third operation includes passing the sixth current in the memory cell before passing the third current.

9. The method according to claim 8, further comprising:
when the polarity of the second current and the polarity of the third current differ from each other and the second operation is subsequent to the third operation, passing the second current in the memory cell after the third current without passing the fifth current.

10. The method according to claim 1, wherein:
the passing the two currents in the first operation includes passing the fourth current in the memory cell before passing the first current;
the passing the two currents in the first operation includes passing the fifth current in the memory cell after passing the second current; and
the passing the two currents in the third operation includes passing the sixth current in the memory cell before passing the third current.

11. The method according to claim 1, wherein:
the passing the two currents in the first operation includes passing the fourth current in the memory cell after passing the first current;
the passing the two currents in the second operation includes passing the fifth current in the memory cell before passing the second current; and
the passing the two currents in the third operation includes passing the sixth current in the memory cell after passing the third current.

12. The method according to claim 1, further comprising:
alternately passing, in the memory cell, a seventh current and an eighth current having a polarity differing from a polarity of the seventh current in a fourth operation,
wherein each of the seventh current and the eighth current is different from the first current, the second current, and the third current.

13. The method according to claim 12, wherein each of the seventh current and the eighth current is smaller than the first current and the second current.

14. The method according to claim 13, wherein each of the seventh current and the eighth current is smaller than the third current.

15. The method according to claim 12, wherein each of a seventh period during which the seventh current flows and an eighth period during which the eighth current flows is shorter than a first period during which the first current flows and a second period during which the second current flows.

16. The method according to claim 12, wherein the fourth operation is performed in response to a command.

* * * * *